United States Patent [19]
Yasuda

[11] Patent Number: 5,963,158
[45] Date of Patent: Oct. 5, 1999

[54] CURRENT AMPLIFIER AND CURRENT MODE ANALOG/DIGITAL CONVERTER USING THE SAME

[75] Inventor: Akira Yasuda, Kawasaki, Japan

[73] Assignee: Kabushiki Kaisha Toshiba, Kawasaki, Japan

[21] Appl. No.: 08/980,344

[22] Filed: Nov. 28, 1997

[30] Foreign Application Priority Data

Nov. 28, 1996 [JP] Japan .................................. 8-317802

[51] Int. Cl.$^6$ .................................................. H03M 1/42
[52] U.S. Cl. ........................ 341/136; 341/122; 341/161; 327/94
[58] Field of Search .................................. 341/122, 136, 341/161, 162, 163; 327/91, 94, 96, 377

[56] References Cited

U.S. PATENT DOCUMENTS

| | | | |
|---|---|---|---|
| 5,418,408 | 5/1995 | Mangelsdorf et al. | 327/94 |
| 5,572,153 | 11/1996 | Vallancourt et al. | 341/136 |
| 5,760,616 | 6/1998 | Vallancourt | 341/94 |

OTHER PUBLICATIONS

David G. Nairn, et al., "Ratio–Independent Current Mode Algorithmic Analog–To–Digital Converters", 1989, pp. 250–253.

Gustavsson et al., New Current Mode Pipeline A/D Coverter Architectures, 1997 IEEE International Symposiumon Circuits and Systems, Jun. 9–12, 1997, Hong Kong, pp. 417420.

Psychalinos, *Noninverting switched–current sample/hold cicuit with compensation of the clock–feedthrough effect*, IEE Proceedings on Circuits, Devices & Systems vol. 144, No. 4, Aug. 1997, pp. 247–248.

Nairn, *A High Linearity Sampling Technique for Switched–Current Circuits* IEEE Transactions on Circuits and Systems–II: Analog and digital Signal processing vol. 43, No. 1 Jan. 1996, pp. 49–52.

Wu et al., *A CMOS Transistor–Only 8–b 4.5–Ms/s Pipelined Analog–to–Digital Converter Using Fully Differential Current–Mode Techniques*, IEEE Journal of Solid–State Circuits, vol. 30 No. 5, May 1995, pp. 522–535.

Sugimoto et al., *A Current–Mode Bit–Block Circuit Applicable to Low–Power Pipeline Video–Speed A/D Converters*, IEICE Transactions on Fundamentals of Electronics, Communications and Computer Sciences, vol. E79–A, No. 2, pp. 199–209, Feb. 1996.

*Primary Examiner*—Howard L. Williams
*Attorney, Agent, or Firm*—Oblon, Spivak, McClelland, Maier & Neustadt, P.C.

[57] ABSTRACT

In a current amplifier, a current obtained by holding an input current from an input terminal by a first current sample/hold circuit is added through a connection to a current obtained by inverting the input current by a current inverter to generate a current twice the input current. This current is alternately sampled and held by second and third current sample/hold circuits and alternately output to an output terminal.

21 Claims, 15 Drawing Sheets

NOTE: THE BROKER LINES INDICATE THE TRAILING EDGES OF CK1, CK2 AND CK22

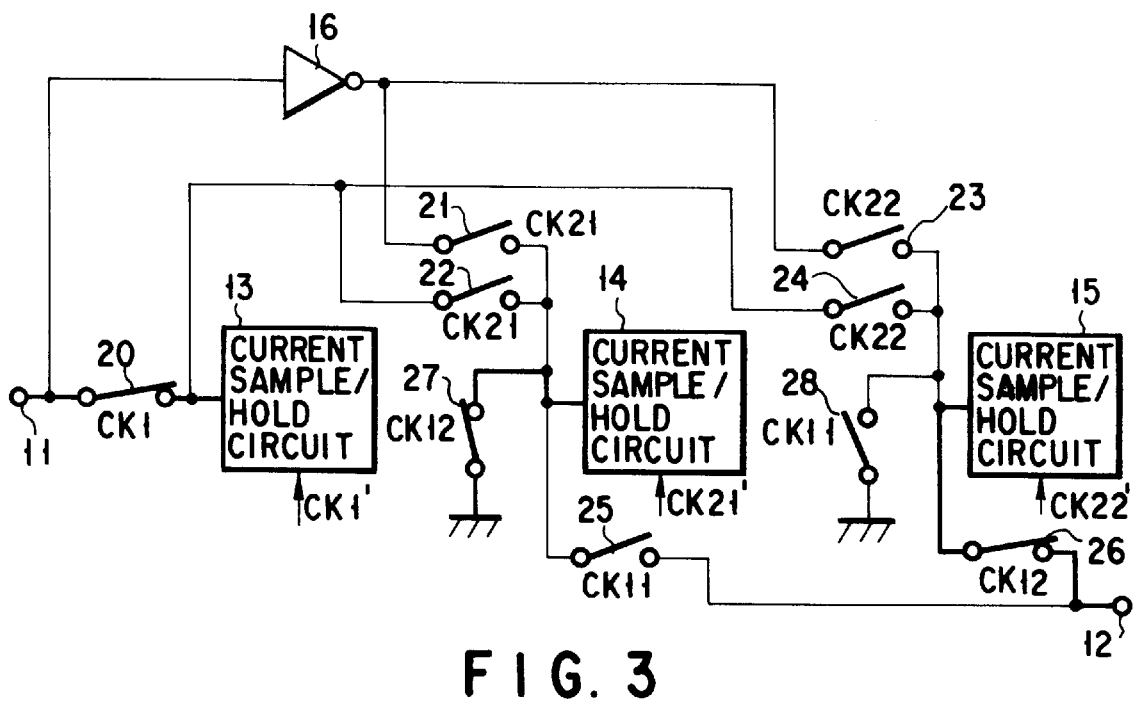
F I G. 3
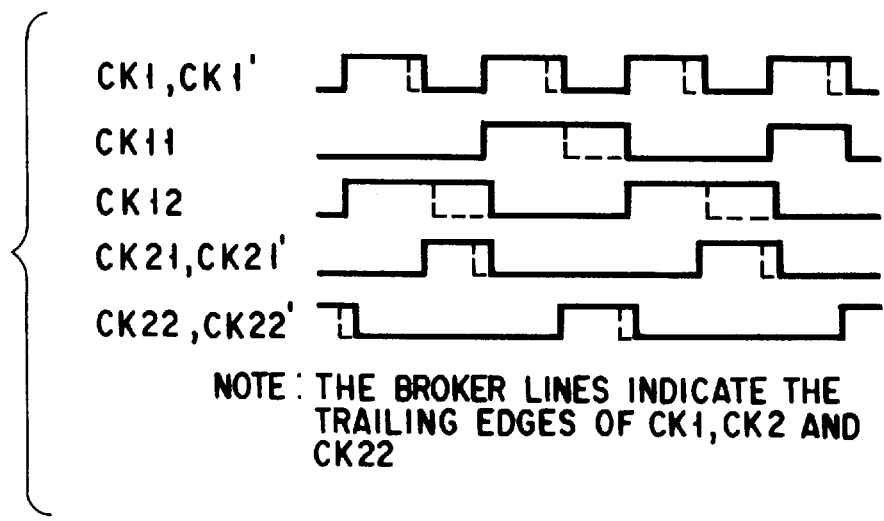
NOTE: THE BROKER LINES INDICATE THE TRAILING EDGES OF CK1, CK2 AND CK22
F I G. 4

NOTE: THE BROKER LINES INDICATE THE TRAILING EDGES OF CK1, CK2 AND CK22

NOTE: THE BROKER LINES INDICATE THE TRAILING EDGES OF CK1, CK2 AND CK22

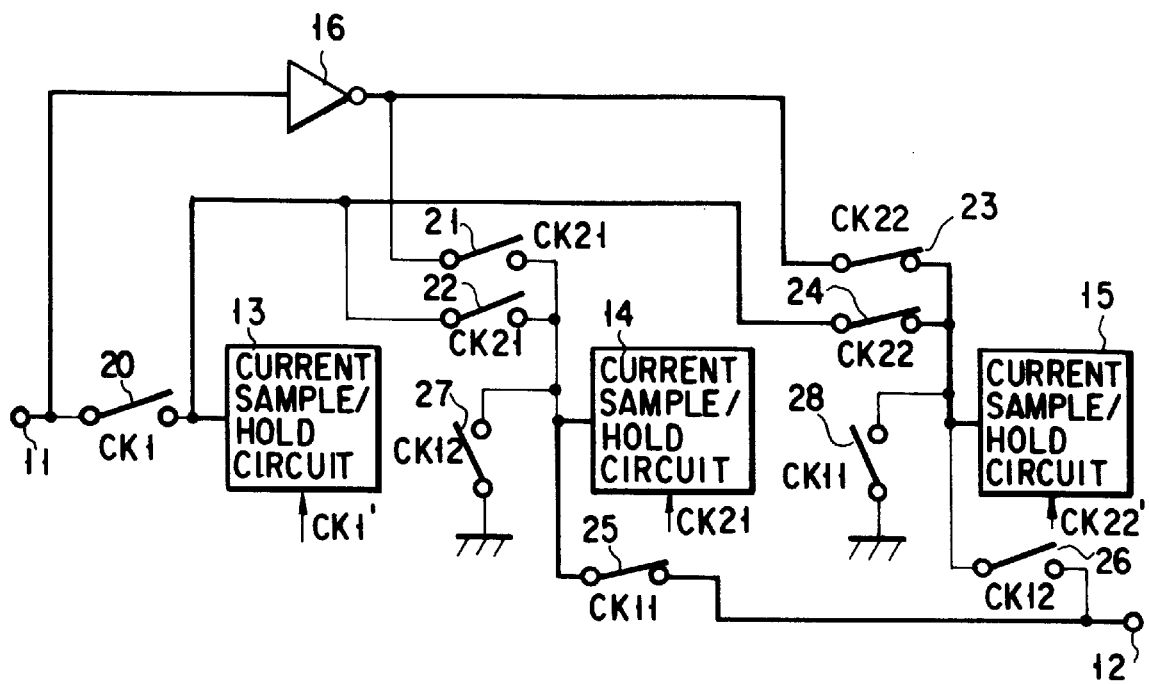
F I G. 9
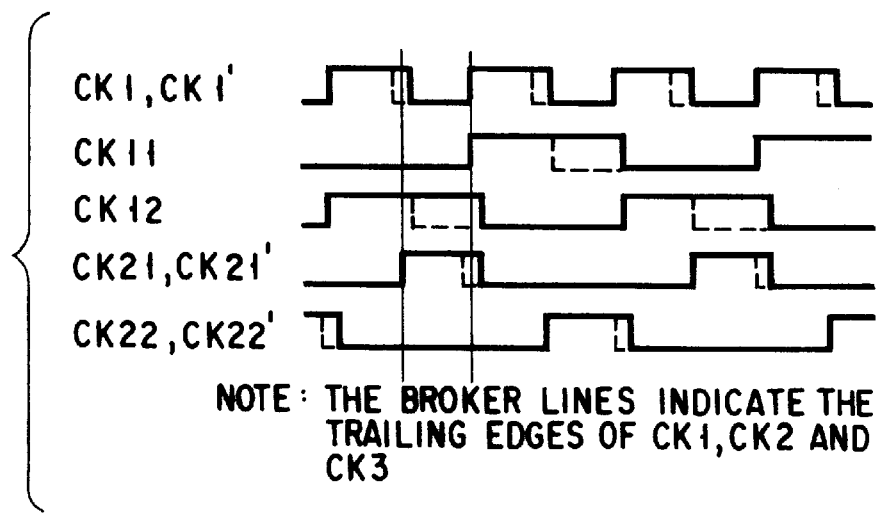
F I G. 10

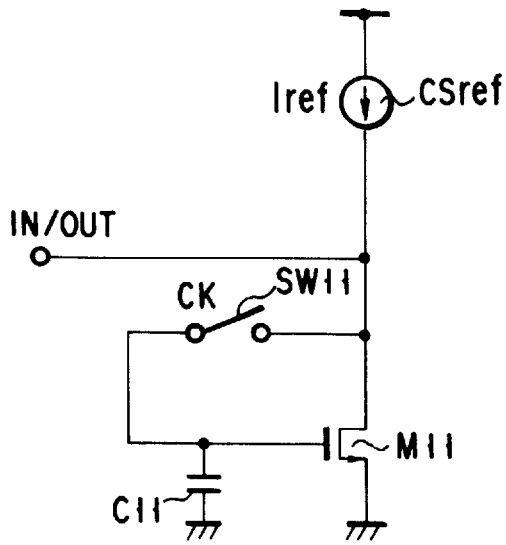
F I G. 11
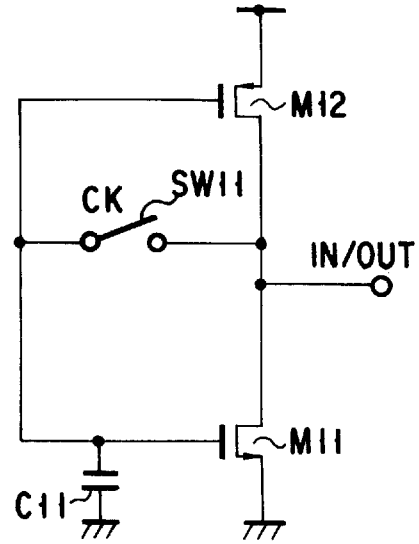
F I G. 12
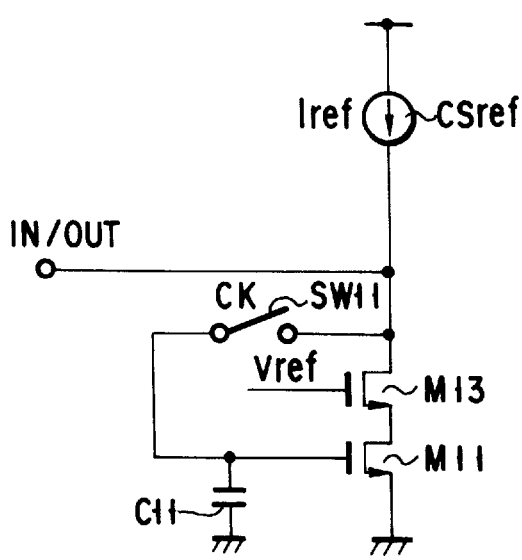
F I G. 13
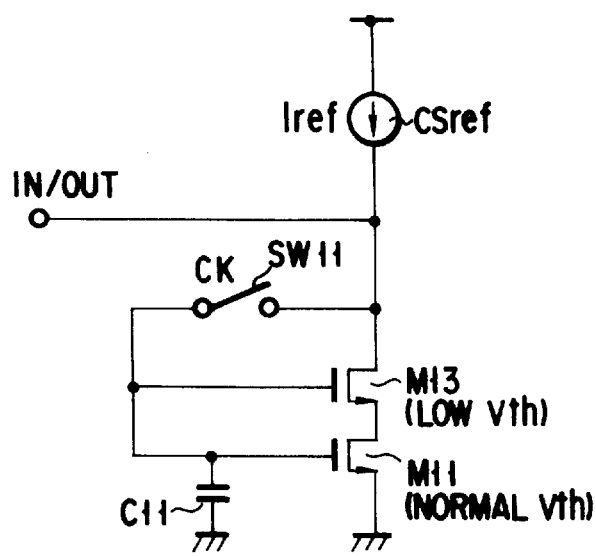
F I G. 14

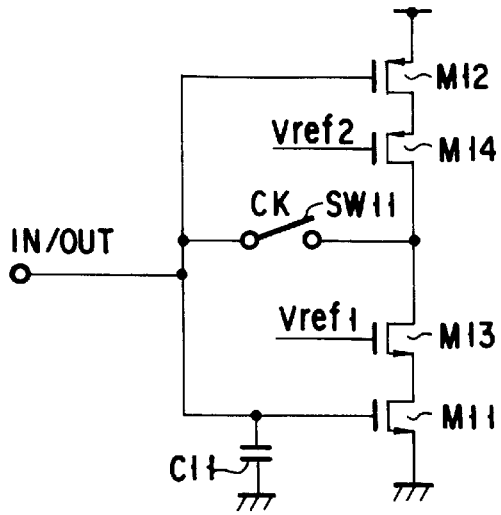
F I G. 15
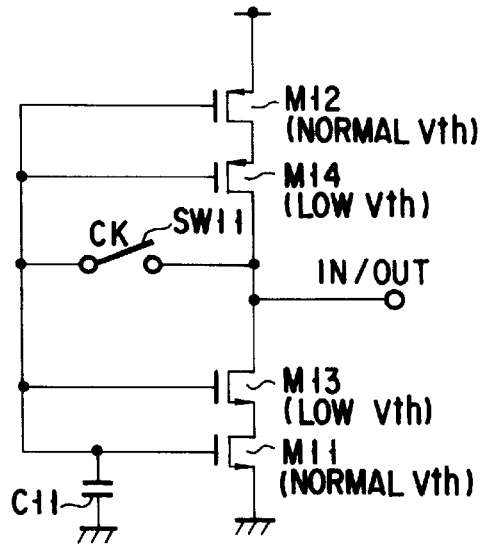
F I G. 16
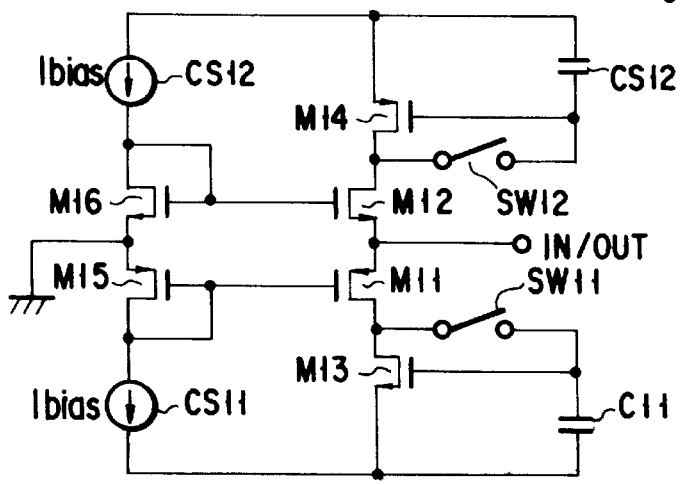
F I G. 17
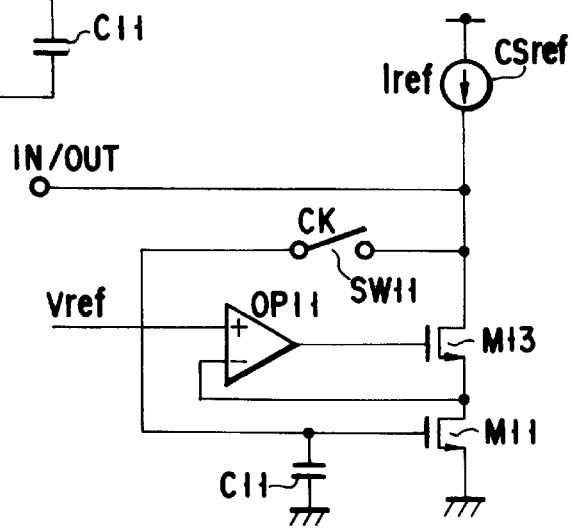
F I G. 18

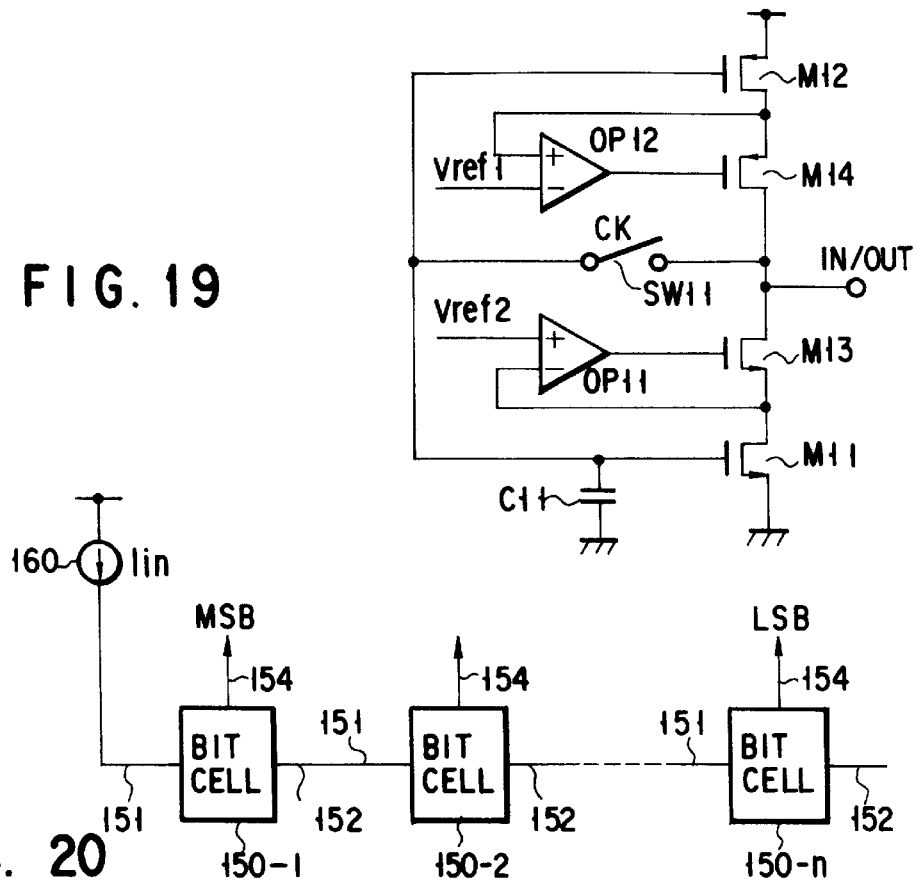
FIG. 19
FIG. 20
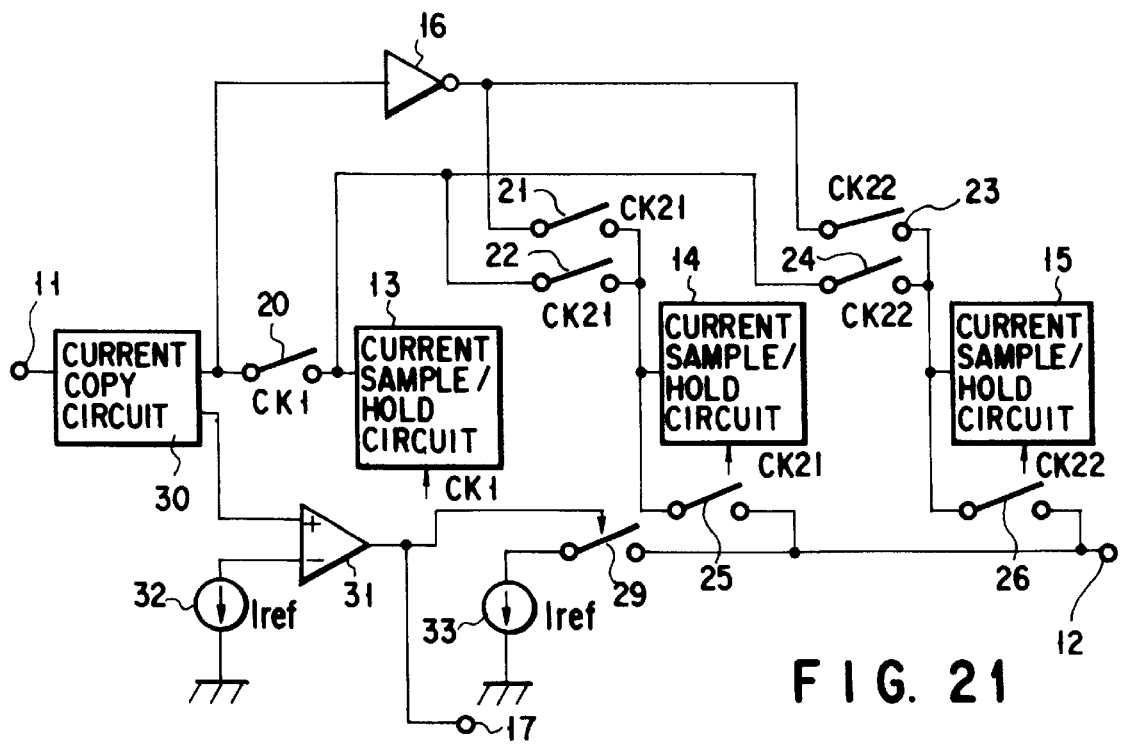
FIG. 21

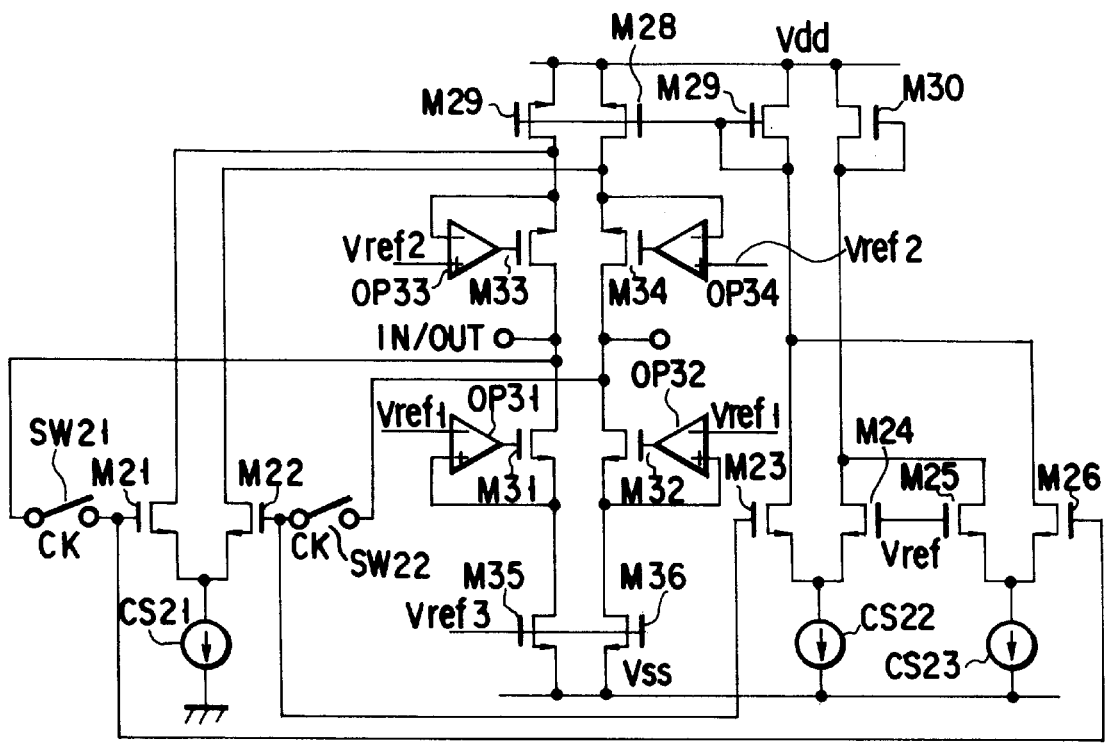
F I G. 30
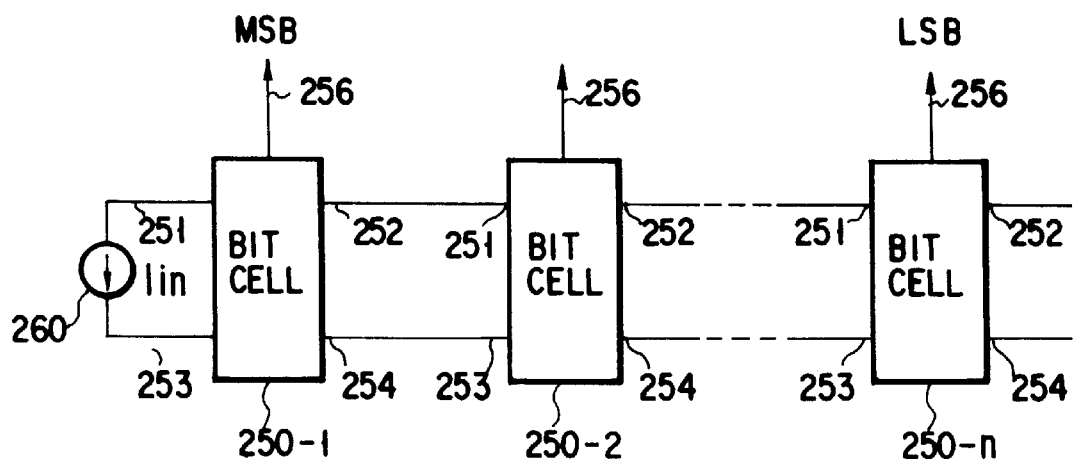
F I G. 31

CURRENT AMPLIFIER AND CURRENT MODE ANALOG/DIGITAL CONVERTER USING THE SAME

BACKGROUND OF THE INVENTION

The present invention relates to a current amplifier for doubling a current and a current mode type analog/digital converter using the same.

As one of analog/digital converters (to be referred to as A/D converters hereinafter), a current mode pipe line type A/D converter is known. The conventional current mode pipe line type A/D converter is constituted by pipe-line-connecting n stages of unit A/D converters called bit cells.

Each bit cell is constituted by a current mirror circuit and a current comparator. An input current is compared with a reference current. The doubled current or a current obtained by subtracting a reference current from this doubled current is output on the basis of the comparison result.

More specifically, the comparison result from the current comparator is output from the digital data output terminal as a 1-bit digital output, and simultaneously, a residual current obtained by subtracting the 1-bit quantized output from the input current is output to the next bit cell as an output current. Such bit cells are pipe-line-connected in n stages to perform n-bit A/D conversion.

To double the input current, the input-to-output current ratio of the current mirror circuit constituted by three transistors is used. This input-to-output current ratio is defined by the ratio of the area of one transistor of the current mirror circuit to the sum of the areas of the remaining two transistors. However, since transistor sizes vary due to manufacturing variations or the like, the input-to-output current ratio of the current mirror cannot be accurately 2. The accuracy of the input-to-output current ratio directly affects the conversion accuracy, so the same accuracy as the desired conversion accuracy is required. When A/D converter is realized using an IC, the relative accuracy of the transistor is roughly 1%. For this reason, the conversion accuracy is substantially limited to 7 bits. If the conversion accuracy is to be increased in this arrangement, the accuracy of devices such as transistors constituting the current mirror circuit must be increased. For this purpose, an expensive process or trimming is required, resulting in an expensive A/D converter.

To increase the conversion accuracy of the current mode pipe line type A/D converter, the current mirror for doubling the input current may be constituted by a switched current mirror. In the switched current mirror, the input current is sampled and held by two current sample/hold circuits, the hold outputs are added to double the input current, and this current is sampled and held by the third current sample/hold circuit and output. According to this technique, a current amplification factor of 2 can be obtained independently of the ratio of transistor sizes, so improvement of the conversion accuracy of the A/D converter can be expected.

In this technique, however, the current sampling/holding operation must be performed twice to double the current: sampling/holding of the input current and sampling/holding the doubled current. For this reason, the current sample/hold circuits must be operated with a clock frequency twice the bit cell, and in other words, at a period ½ the conversion period of the A/D converter. The circuit must be operated at a higher speed. In high-speed A/D conversion, the input current can hardly be properly sampled and held due to the transient response of the circuit, and the conversion accuracy of the A/D converter cannot be so largely improved.

Generally, to form an A/D converter into an IC, a differential circuit is used to minimize the influence of noise from the digital system. When the above-described current sample/hold circuit has a differential arrangement, the common mode component of a differential current must be properly canceled. If the common mode component cannot be completely canceled, the current of the common mode component is also doubled, and accordingly, the output current is saturated. If the common mode component is nonuniformly corrected for the positive and negative phases of the differential current, the nonuniform component is added to the differential output current as a differential current component. This results in an error in differential output current, and consequently, a conversion error of the A/D converter.

However, when the common mode component is to be canceled using the current mirror, matching between the positive- and negative-phase currents depends on matching of transistor sizes of the current mirror, as described above. The common mode component cannot be uniformly corrected for the positive and negative phases of the differential current, so the current of the common mode component is difficult to accurately cancel.

As described above, in the conventional current mode pipe line type A/D converter, the conversion accuracy is directly influenced by manufacturing variations of transistors. When a switched current mirror is used to avoid this problem, the operation speed of the circuit is doubled, and accordingly, the conversion accuracy degrades due to the transient response, or power consumption increases. When a differential arrangement is employed to minimize the influence of noise from the digital system, the common mode component must be accurately canceled although this can hardly be realized.

BRIEF SUMMARY OF THE INVENTION

It is an object of the present invention to provide a current amplifier for doubling a current, which can achieve a high accuracy without increasing the requirement for the operation speed, and a current mode analog/digital converter using the same.

It is another object of the present invention to provide a current amplifier for doubling a current, which can reliably cancel the common mode component of a differential current in a differential arrangement, and a current mode analog/digital converter using the same.

According to the present invention, there is provided a current amplifier comprising a first current sample/hold circuit for sampling and holding an input current at a predetermined period, a current inverter for inverting the input current, a current adder for adding an output current from the current inverter and an output current from the first current sample/hold circuit, second and third current sample/hold circuits for alternately sampling and holding an output current from the current adder, and an output circuit for alternately outputting, as an output current, the current held by the second and third current sample/hold circuits.

In this current amplifier, the current obtained by sampling and holding the input current by the first current sample/hold circuit at the predetermined period is added to the current obtained by inverting the input current to generate a current twice the input current. This current is alternately sampled and held by the second and third current sample/hold circuit and alternately output, thereby doubling the current. The accuracy of the current amplification factor is not influenced by the accuracy of devices such as transistors, unlike the conventional current amplifier which doubles a current in accordance with the input-to-output current ratio of the current mirror. In addition, since the device accuracy need not be high, neither complex process nor trimming is required, and the cost can be reduced. Furthermore, unlike the technique using a switched current mirror, the circuit need not be operated at a speed twice the sampling rate. Therefore, the accuracy does not degrade due to the transient response of the circuit even in a high-speed operation, and the power consumption can also be reduced.

In the present invention, a circuit for connecting output terminals of the second and third current sample/hold circuit to a predetermined constant potential point during a period other than an output period may be arranged. With this arrangement, potential variations of the output terminal of the current sample/hold circuit are minimized.

According to the present invention, there is provided a current amplifier comprising a first current sample/hold circuit for sampling and holding a differential input current at a predetermined period, a current adder for adding the differential input current and a differential output current from the first current sample/hold circuit, second and third current sample/hold circuits for alternately sampling and holding a differential output current from the current adder, and an output circuit for alternately outputting, as an output current, the differential current held by the second and third current sample/hold circuits.

The current adder preferably connects and adds, through a connection, a positive-phase current from the differential output current from the first current sample/hold circuit to a negative-phase current of the differential input current, and a negative-phase current of the differential output current to the positive-phase current of the differential input current. With this arrangement, the special current inverter can be omitted.

In such a differential arrangement, the common mode component of the differential current is preferably canceled. According to the present invention, the common mode component can be canceled by processing in the current amplifier without arranging any circuit exclusively used to cancel the common mode component. Therefore, saturation of the output current which occurs when the current of the common mode component is amplified together with the current of the signal component, or errors generated when the common mode component is nonuniformly corrected for the positive and negative phases of the differential current, and the nonuniform component is added to the differential output current as a differential current can be prevented.

According to the present invention, there is provided a first A/D converter comprising a first current sample/hold circuit for sampling and holding an input current at a predetermined period, a current inverter for inverting the input current, a current adder for adding an output current from the current inverter and an output current from the first current sample/hold circuit, second and third current sample/ hold circuits for alternately sampling and holding an output current from the current adder, a first output circuit for alternately outputting, as an output current, the current held by the second and third current sample/hold circuits, a current comparator for comparing the input current with a reference current and outputting digital data, and a second output circuit for selectively outputting one of the output current and a difference current between the output current and the reference current in accordance with a comparison result from the current comparator.

The current amplifier can accurately double the input current without being influenced by the device accuracy. Therefore, when an A/D converter is arranged using this current amplifier, a high conversion accuracy can be realized.

According to the present invention, there is provided a second A/D converter comprising a first current sample/hold circuit for sampling and holding a differential input current at a predetermined period, a current adder for adding the differential input current and a differential output current from the first current sample/hold circuit, second and third current sample/hold circuits for alternately sampling and holding an output current from the current adder, a first output circuit for alternately outputting, as an output current, the current held by the second and third current sample/hold circuits, a current comparator comparing the differential input current with a reference current and outputting digital data, and a second output circuit for selectively outputting one of the differential output current and a difference current between the differential output current and the reference current in accordance with a comparison result from the current comparator.

The current amplifier having a differential arrangement can accurately double the input current without being influenced by the device accuracy and also reliably cancel the common mode component of the differential current. Therefore, when an A/D converter is arranged using this current amplifier, a high conversion accuracy can be realized. In addition, because of the differential arrangement, this system stands noise from the digital system.

According to the present invention, when a plurality of first or second A/D converters as unit A/D converters are pipe-line-connected, an accurate current mode pipe line type analog/digital converter can be realized. In addition, when the output terminal of the first or second A/D converter is connected to the input terminal, accurate current mode cyclic type analog/digital converter can be realized.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE SEVERAL
VIEWS OF THE DRAWING

The accompanying drawings, which are incorporated in and constitute a part of the specification, illustrate presently preferred embodiments of the invention, and together with the general description given above and the detailed description of the preferred embodiments give below, serve to explain the principles of the invention.

FIG. 3 is a circuit diagram showing the current amplifier so as to explain the operation of the first embodiment;

FIG. 4 is a timing chart of signals in the circuit shown in FIG. 3;

FIG. 9 is a circuit diagram showing the current amplifier so as to explain the operation of the first embodiment;

FIG. 10 is a timing chart of signals in the circuit shown in FIG. 9;

FIG. 11 is a circuit diagram showing a current sample/hold circuit;

FIG. 12 is a circuit diagram showing another current sample/hold circuit;

FIG. 13 is a circuit diagram showing still another current sample/hold circuit;

FIG. 14 is a circuit diagram showing still another current sample/hold circuit;

FIG. 15 is a circuit diagram showing still another current sample/hold circuit;

FIG. 16 is a circuit diagram showing still another current sample/hold circuit;

FIG. 17 is a circuit diagram showing still another current sample/hold circuit;

FIG. 18 is a circuit diagram showing still another current sample/hold circuit;

FIG. 19 is a circuit diagram showing still another current sample/hold circuit;

FIG. 20 is a block diagram showing the arrangement of a current mode pipe line type A/D converter according to the second embodiment of the present invention;

FIG. 21 is a circuit diagram showing the arrangement of a bit cell in the second embodiment;

FIG. 30 is a circuit diagram showing still another differential current sample/hold circuit;

FIG. 31 is a block diagram showing the arrangement of a current mode pipe line type A/D converter according to the fourth embodiment of the present invention;

DETAILED DESCRIPTION OF THE INVENTION

The embodiments of the present invention will be described below with reference to the accompanying drawing.

Figure 1:
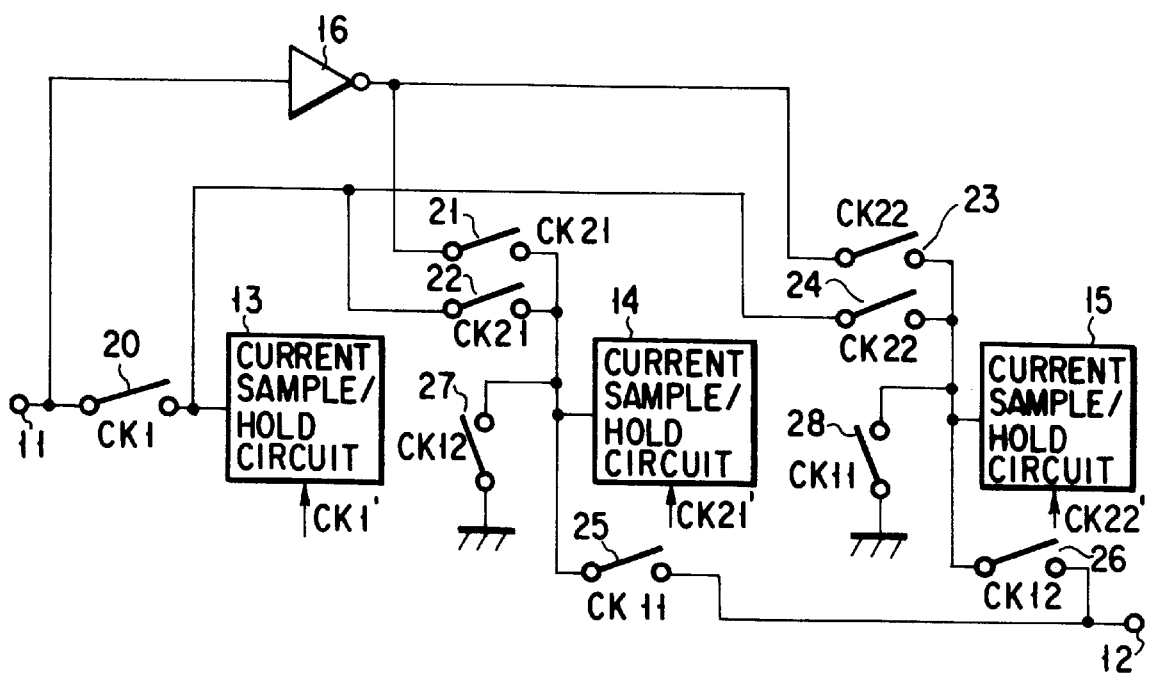
FIG. 1 is a block diagram showing the arrangement of a current amplifier according to the first embodiment.

Referring to FIG. 1, a current amplifier doubles the input current from a current input terminal 11 and outputs the doubled current from a current output terminal 12. The current amplifier comprises first, second, and third current sample/hold circuits 13, 14 and 15, a current inverter 16, and switches 20 to 28. Each of the switches 20 to 28 is formed from, e.g., a MOS transistor. Each of the current sample/hold circuits 13 to 15 has a terminal commonly used as input/output terminals.

Figure 2:
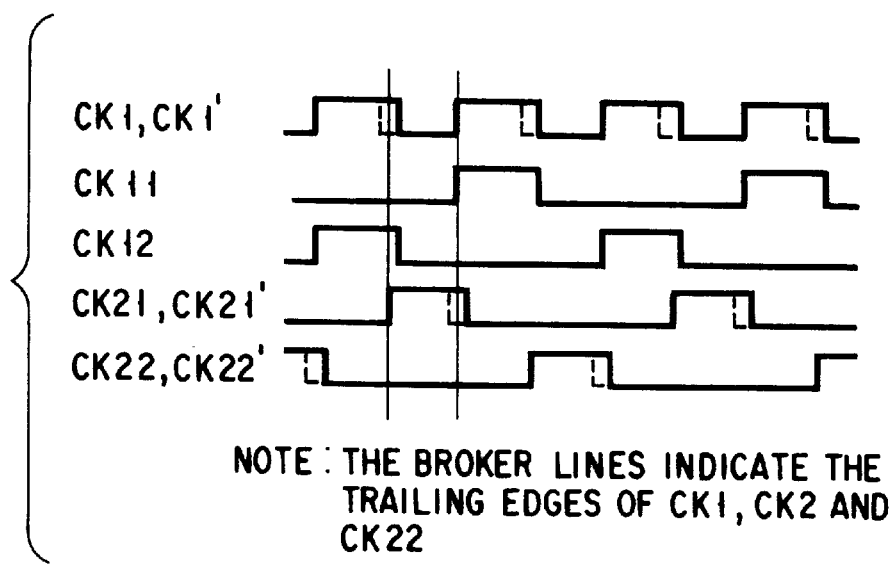
FIG. 2 is a timing chart of signals in the circuit shown in FIG. 1.

FIG. 2 is a timing chart of clocks CK1, CK1', CK11, CK12, CK21, CK21', CK22, and CK22' for controlling the switches 20 to 28 and the current sample/hold circuits 13 to 15. When a clock is at "H", a corresponding switch is turned on. When a clock is at "L", a corresponding switch is turned off.

The basic operation of the current amplifier will be described. The input current from the current input terminal 11 is sampled and held by the first current sample/hold circuit 13. The output current from the first current sample/hold circuit 13 is added to a current obtained by inverting the input current by the current inverter 16 to generate a current twice the input current. This sum current is alternately sampled and held by the second and third current sample/hold circuits 14 and 15. When currents are output from the second and third current sample/hold circuits 14 and 15, an output current corresponding to a current twice the input current is output from the current output terminal 12 every period of the clock CK1.

The operation of this embodiment will be described next in detail with reference to FIGS. 3 to 10. To help to understand the operation of the current amplifier shown in FIG. 1, states in various operation modes and clock timings are shown in FIGS. 3 to 9. In FIGS. 3, 5, 7, and 9, the signal current path in each mode is indicated by a bold line.

<First Operation Mode>

In the first operation mode, the input current from the current input terminal 11 is input to the first current sample/hold circuit 13 through the switch 20 which is turned on in response to the clock CK1, sampled and held by the current sample/hold circuit 13 at the timing of the clock CK1', as shown in FIGS. 3 and 4. At this time, the current from the third current sample/hold circuit 15 is output from the current output terminal 12 through the switch 26 which is turned on in response to the clock CK12.

At this time, to prevent an undesired potential variation, the output terminal of the second current sample/hold circuit 14 is connected to a constant potential point, e.g., ground through the switch 27 which is turned on in response to the clock CK12. More specifically, the current sample/hold circuit 14 is constituted by a current source. When the output terminal has a high impedance, the potential of the output terminal largely changes to saturate the circuit or prolong the transient response time in the next sampling operation, so such potential variation is prevented by the above arrangement. If degradation in A/D conversion accuracy due to the potential variation of the output terminal of the second current sample/hold circuit 14 does not pose a problem, this arrangement need not always be employed.

<Second Operation Mode>

Figure 5:
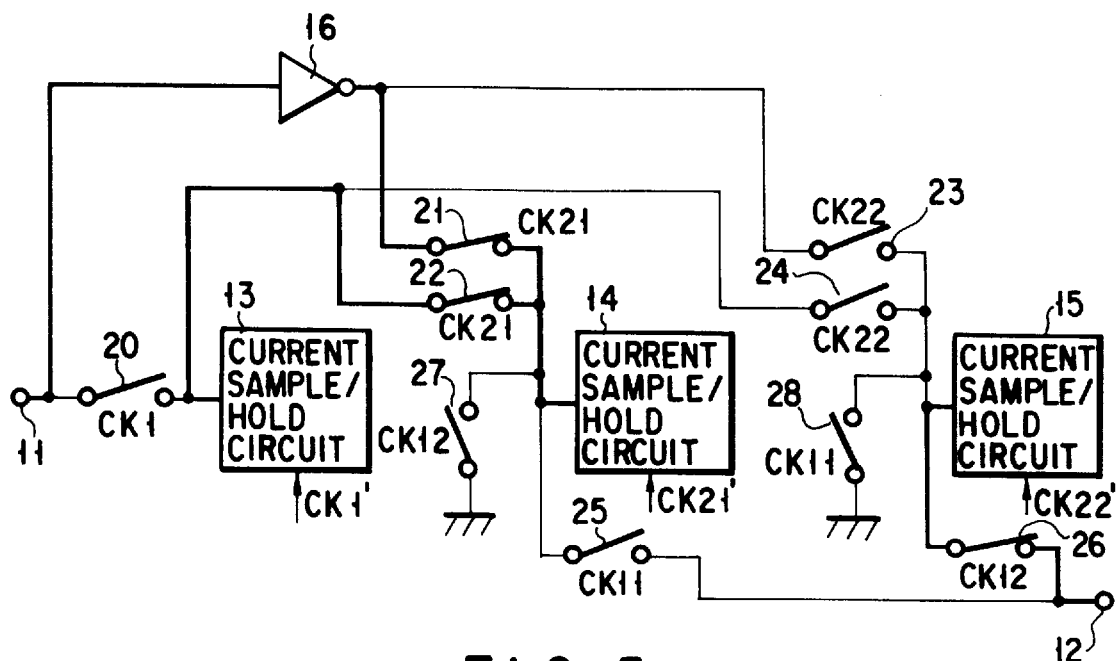
FIG. 5 is a circuit diagram showing the current amplifier so as to explain the operation of the first embodiment.
Figure 6:
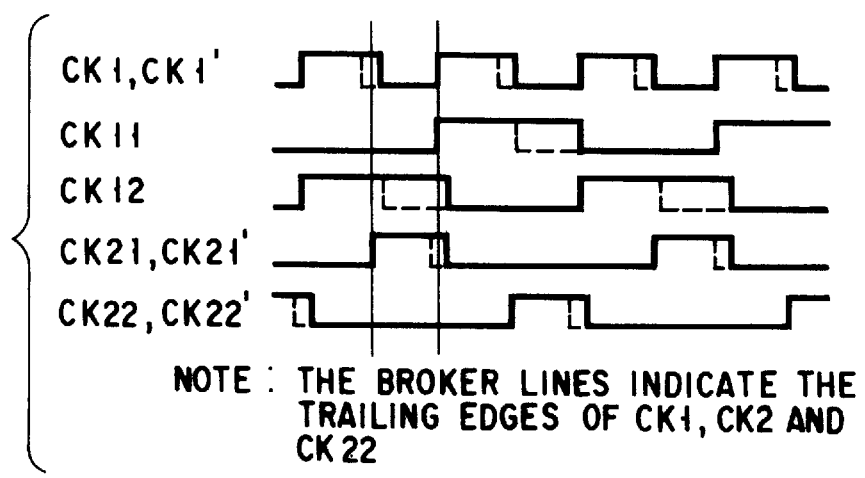
FIG. 6 is a timing chart of signals in the circuit shown in FIG. 5.

In the second operation mode, the switches 21 and 22 are turned on in response to the clock CK21, so a current obtained by inverting the input current from the current input terminal 11 by the current inverter 16 is added, through a connection, to the output current from the first current sample/hold circuit 13, as shown in FIGS. 5 and 6. This sum current is sampled and held by the second current sample/hold circuit 14 in response to the clock CK21'. With this operation, a current twice the input current is held by the second current sample/hold circuit 14. At this time, the switch 26 is turned on in response to the clock CK12, so the current held by the third current sample/hold circuit 15 is output from the current output terminal 12 through the switch 26.

<Third Operation Mode>

Figure 7:
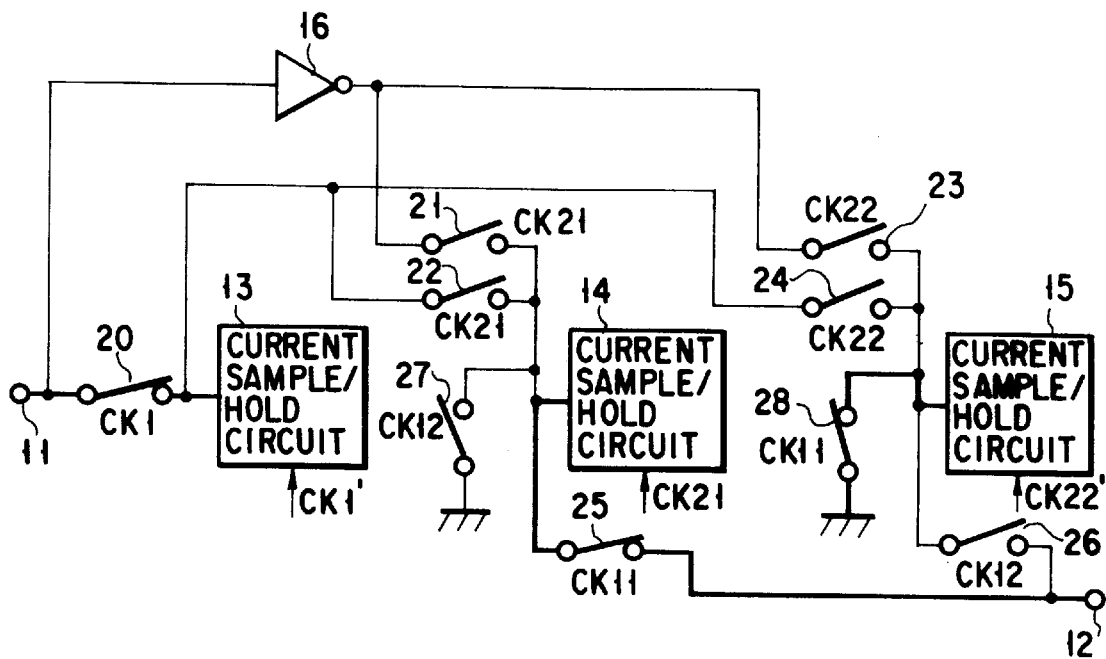
FIG. 7 is a circuit diagram showing the current amplifier so as to explain the operation of the first embodiment.
Figure 8:
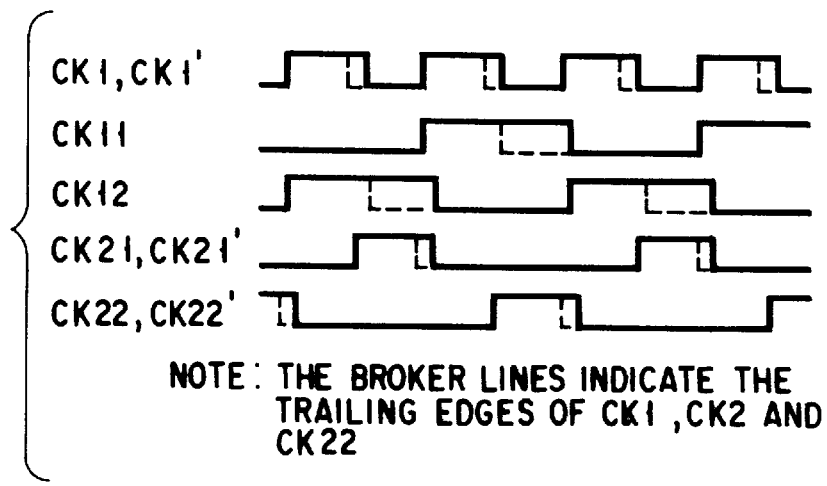
FIG. 8 is a timing chart of signals in the circuit shown in FIG. 7.

In the third operation mode, the switch 25 is turned on in response to the clock CK11, so the current twice the input current, which is held by the second current sample/hold circuit 15, is output through the switch 25, as shown in FIGS. 7 and 8. The input current is sampled and held by the current sample/hold circuit 13 in response to the clock CK1.

At this time, to prevent an undesired potential variation, the output terminal of the third current sample/hold circuit 15 is connected to a constant potential point, e.g., ground through the switch 28 which is turned on in response to the clock CK11. If degradation in A/D conversion accuracy due to the potential variation of the output terminal of the third current sample/hold circuit 15 does not pose a problem, this arrangement need not always be employed.

<Fourth Operation Mode>

In the fourth operation mode, the switches 23 and 24 are turned on in response to the clock CK22, so a current obtained by inverting the input current from the current input terminal 11 by the current inverter 16 is added, through the connection, to the output current from the first current sample/hold circuit 13, as shown in FIGS. 9 and 10. This sum current is sampled and held by the third current sample/hold circuit 15 in response to the clock CK22'. With this operation, a current twice the input current is held by the third current sample/hold circuit 15. At this time, the switch 25 is turned on in response to the clock CK11, so the current held by the second current sample/hold circuit 14 is output from the current output terminal 12 through the switch 25.

As described above, in this embodiment, the current obtained by sampling and holding the input current by the first current sample/hold circuit 13 at a predetermined period is added to a current obtained by inverting the input current by the current inverter 16 to generate a current twice the input current. This current is alternately sampled and held by the second and third current sample/hold circuits 14 and 15 and alternately output. With this arrangement, a current amplifier for doubling a current can be realized.

The accuracy of the current amplification factor is not influenced by the accuracy of devices such as transistors constituting the current mirror, unlike bit cells used in the conventional current mode pipe line type A/D converter for doubling the current in accordance with the input-to-output current ratio of the current mirror. For this reason, when the current amplifier is used for an A/D converter, as will be described later, a high conversion accuracy can be obtained independently of the device accuracy. Since the device accuracy need not be increased, neither complex process nor trimming is required, so the cost can be reduced.

In addition, the current sample/hold circuit or current inverter need not be operated at a speed twice the sampling rate, unlike the conventional arrangement using the switched current mirror. For this reason, even when the operation speed is increased, the conversion accuracy does not degrade due to the transient response of the circuit, so the current consumption can be reduced.

In this embodiment, as shown in FIGS. 4, 6, 8, and 10, the output terminal of one of the second and third current sample/hold circuits 14 and 15 is always connected to the constant potential point, e.g., ground while a current is being output from the other current sample/hold circuit. With this arrangement, the potential of the output terminal can be prevented from largely changing.

(Arrangements of Current Sample/hold Circuit)

Arrangements of the current sample/hold circuit used in the first embodiment will be described next with reference to FIGS. 11 to 19.

A current sample/hold circuit shown in FIG. 11 comprises a reference current source CSref, an n-channel MOS transistor M11 connected between the reference current source CSref and ground, a sampling switch SW11 connected between the drain and source of the transistor M11, and a holding capacitor C11 connected between the gate of the transistor M11 and ground. The drain of the transistor M11 is connected to an input/output terminal IN/OUT.

In the sample mode, the switch SW11 is turned on, and the transistor M11 is set in a diode connection state, i.e., the drain and gate are connected to each other. At this time, the input current and a reference current Iref from the reference current source CSref flow to the transistor M11. In the hold mode, the switch SW11 is turned off. Since the gate voltage of the transistor M11 is held in the capacitor C11 and the gate capacitance of the transistor M11, the same current as that before the switch SW11 is turned off flows to the transistor M11. More specifically, an output current corresponding to the input current in the sample mode is output from the input/output terminal IN/OUT and held.

The gate capacitance of the transistor M11 suffices as a capacitor for holding the current, and the capacitor C11 can be omitted. However, when the switch SW11 is formed from a MOS transistor, channel charges flow into the gate capacitance in the OFF state of the switch SW11. This varies the gate potential of the transistor M11, so the hold current value may differ from the input current value. When the current need be more accurately held, variations in gate potential in flowing the same charges can be minimized by using the capacitor C11, so the variations in held current can be reduced.

In a current sample/hold circuit shown in FIG. 12, the n-channel MOS transistor M11 and a p-channel MOS transistor M12 are connected in series, and the drains of the transistors M11 and M12 are connected to the input/output terminal IN/OUT through the switch SW11. The capacitor C11 is connected between the gate of the transistor M11 and ground. The gate of the transistor M11 is also connected to the input/output terminal IN/OUT.

In the sample mode, when the switch SW11 is turned on, the input current from the input/output terminal IN/OUT flows to one of the transistors M11 and M12 in accordance with its direction. In the hold mode, when the switch SW11 is turned off, the gate voltages of the transistors M11 and M12 are held in the capacitor C11, and the same current as that before the switch SW11 is turned off flows to the transistors M11 and M12, as in the arrangement shown in FIG. 11. Therefore, a current corresponding to the input current in the sample mode flows to the input/output terminal IN/OUT, and the input current is held.

In the arrangement shown in FIG. 11, the maximum value of the attracted current of the input current is limited by the magnitude of the reference current Iref. However, in the current sample/hold circuit shown in FIG. 12, the maximum values of the attracted and discharged currents are not particularly limited by the reference current Iref. In this circuit, the bias current flowing through the transistors M11 and M12 can be controlled by the power supply voltage.

In this current sample/hold circuit, the transient response time in the sample mode is represented as C/gm where C is the capacitance of the capacitor C11, and gm is the transconductance of a transconductor constituted by the transistors M11 and M12. When the power supply voltage is raised, the transconductance gm increases to allow a high-speed operation.

In a current sample/hold circuit shown in FIG. 13, a transistor (cascade transistor) M13 is cascade-connected to the transistor M11 in the example shown in FIG. 11. A reference voltage Vref is applied to the gate of the cascade transistor M13. According to this arrangement, the output impedance in the hold mode becomes high, and the sample/hold error due to the difference between the voltages of the input/output terminal IN/OUT in the sample and hold modes can be reduced.

In a current sample/hold circuit shown in FIG. 14, the cascade transistor M13 shown in FIG. 13 is constituted by a low threshold voltage (Low Vth) type transistor, and the gates of the transistors M11 and M13 are commonly connected. With this arrangement, the bias voltage (reference voltage Vref shown in FIG. 13) for the cascade transistor M13 can be omitted, so the circuit can be more easily realized.

In a current sample/hold circuit shown in FIG. 15, cascade transistors M13 and M14 are connected to the transistors M11 and M12 shown in FIG. 12, respectively. Reference voltages Vref1 and Vref2 as bias voltages are applied to the gates of the cascade transistors M13 and M14, respectively. According to this arrangement, the output impedance can be made high, as in FIG. 13, so the sample/hold accuracy can be improved.

In a current sample/hold circuit shown in FIG. 16, each of the cascade transistors M13 and M14 in FIG. 15 is constituted by a low threshold voltage (Low Vth) type transistor, and the gates of the transistors M11 and M13 and the gates of the transistors M12 and M14 are commonly connected. According to this arrangement, the reference voltages Vref1 and Vref2 as bias voltages for the transistors M13 and M14 in FIG. 15 can be omitted, so the circuit can be more easily realized.

In a current sample/hold circuit shown in FIG. 17, in the sample mode, when the switches SW11 and SW12 are ON, the gate voltages of the transistors M13 and M14 change in correspondence with the magnitude of the input current which is input from the input/output terminal IN/OUT through the transistors M11 and M12. In the hold mode, when the switches SW11 and SW12 are turned off, the gate voltages are held by the capacitors C11 and C12, respectively. In this arrangement as well, the maximum value of the input current is not limited by the bias current. Therefore, a large current can be handled while the current consumption is reduced.

In a current sample/hold circuit shown in FIG. 18, a so-called regulated cascade arrangement is applied to the current sample/hold circuit shown in FIG. 13. The drain voltage of the transistor M11 is fed back by an operational amplifier OP11 and kept constant. The output impedance of the current sample/hold circuit constituted by the transistors M11 and M13 and the operational amplifier OP11 becomes very high. For this reason, changes in output current due to the voltage change of the input/output terminal IN/OUT is minimized, and the sample/hold error can be decreased.

In a current sample/hold circuit shown in FIG. 19, the regulated cascade arrangement is applied to the current sample/hold circuit shown in FIG. 15. The drain voltages of the transistors M11 and M12 are respectively kept constant by the feedback loop formed by the operational amplifier OP11 and the transistor M13 and that formed by an operational amplifier OP12 and the transistor M14. According to this arrangement, the output impedance can be made high. Variations in output current due to load variations can be minimized, so the sample/hold accuracy, and accordingly, the A/D conversion accuracy can be improved.

An embodiment of a current mode pipe line type A/D converter using the current amplifier described in the first embodiment will be described next. FIG. 20 is a schematic block diagram of the current mode pipe line type A/D converter. An input current Iin from a current source 160 is passed through a plurality of bit cells (unit A/D converters) 150-1, 150-2, . . . , 150-n which are pipe-line-connected, thereby obtaining an n-bit A/D conversion output.

FIG. 21 shows the arrangement of one bit cell. The same reference numerals as in FIG. 1 denote the same parts in FIG. 21. In this bit cell, a switch 29, a current copy circuit 30, a current comparator 31, reference current sources 32 and 33, and a digital data output terminal 17 are added to the current amplifier described in the first embodiment, which comprises the current sample/hold circuits 13 to 15, the current inverter 16, the switches 20 to 26, the current input terminal 151, and the current output terminal 152.

The current from the current input terminal 151 is input to the current amplifier through the current copy circuit 30, doubled as in the first embodiment, and output from the current output terminal 152. The input current is coped by the current copy circuit 30 to the input terminal of the current comparator 31 and compared with a reference current Iref from the reference current source 32 by the current comparator 31. The switch 29 is ON/OFF-controlled in accordance with the comparison result from the current comparator 31, and the output current from the current amplifier or a current obtained by subtracting the reference current Iref from the reference current source 33 from the output current of the current amplifier is output from the current output terminal 152.

With the series of operations, 1-bit A/D conversion is performed. The output from the current comparator 31 is output from a digital data output terminal 154. Simultaneously, the residual current obtained by subtracting the 1-bit quantized output from the input current Iin is output from the current output terminal 152 to the next bit cell as an output current. By pipe-line-connecting the n bit cells, as shown in FIG. 20, n-bit A/D conversion is performed.

Figure 22:
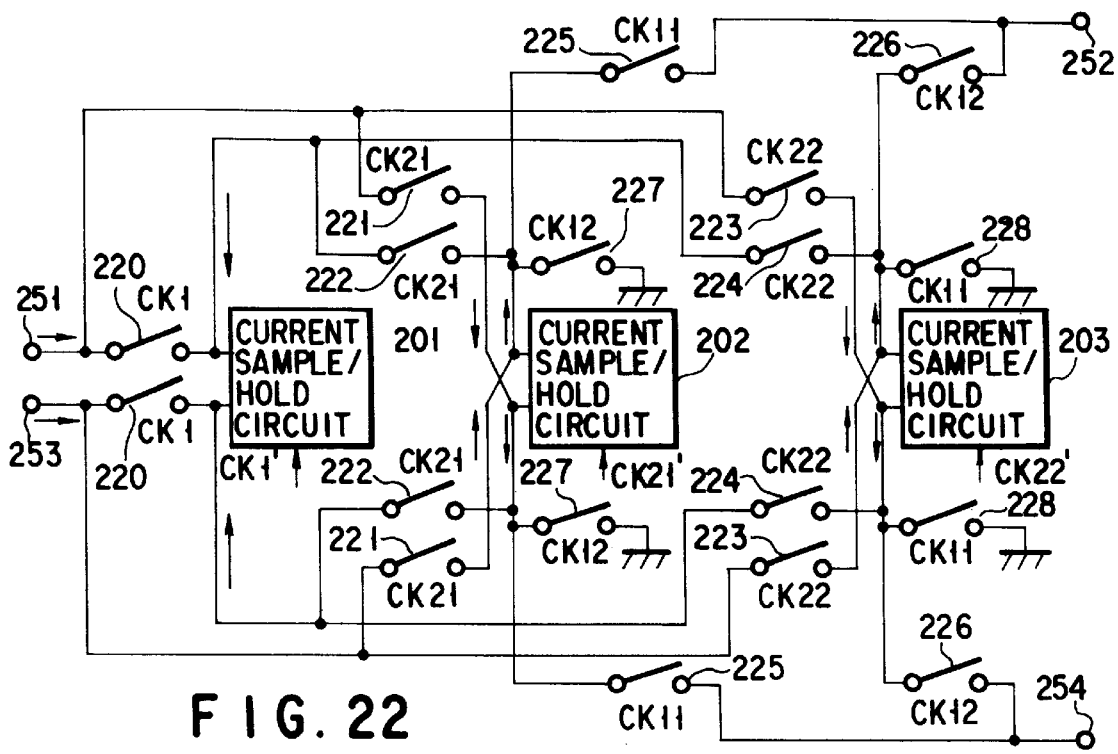
FIG. 22 is a block diagram showing the arrangement of a current amplifier according to the third embodiment of the present invention.

FIG. 22 shows the arrangement of a current amplifier according to the third embodiment of the present invention. In this embodiment, the current amplifier employs a differential arrangement to avoid the influence of noise from the digital system when the A/D converter is to be formed into an IC. In this current amplifier, the differential input current from differential current input terminals 251 and 253 is doubled and output from differential current output terminals 252 and 254 as a differential output current. The current amplifier comprises first, second, and third differential current sample/hold circuits 201, 202, and 203 and switches 220 to 228. Each of the switches 220 to 228 is formed from, e.g., a MOS transistor. Each of the current sample/hold circuits 201 to 203 has terminals commonly used as input/output terminals.

In this embodiment, the current inverter 16 used in the first embodiment shown in FIG. 1 is omitted. Instead, the differential input current from the differential current input terminals 251 and 253 is input to the second and third differential current sample/hold circuits 202 and 203 in phase opposite to that of the input to the first differential current sample/hold circuit 201.

The operation of this embodiment will be described next in detail with reference to FIGS. 23 to 27. To help to understand the operation of the current amplifier shown in FIG. 22, the signal current path in each mode is indicated by a bold line in FIGS. 23 to 27.

<First Operation Mode>

Figure 23:
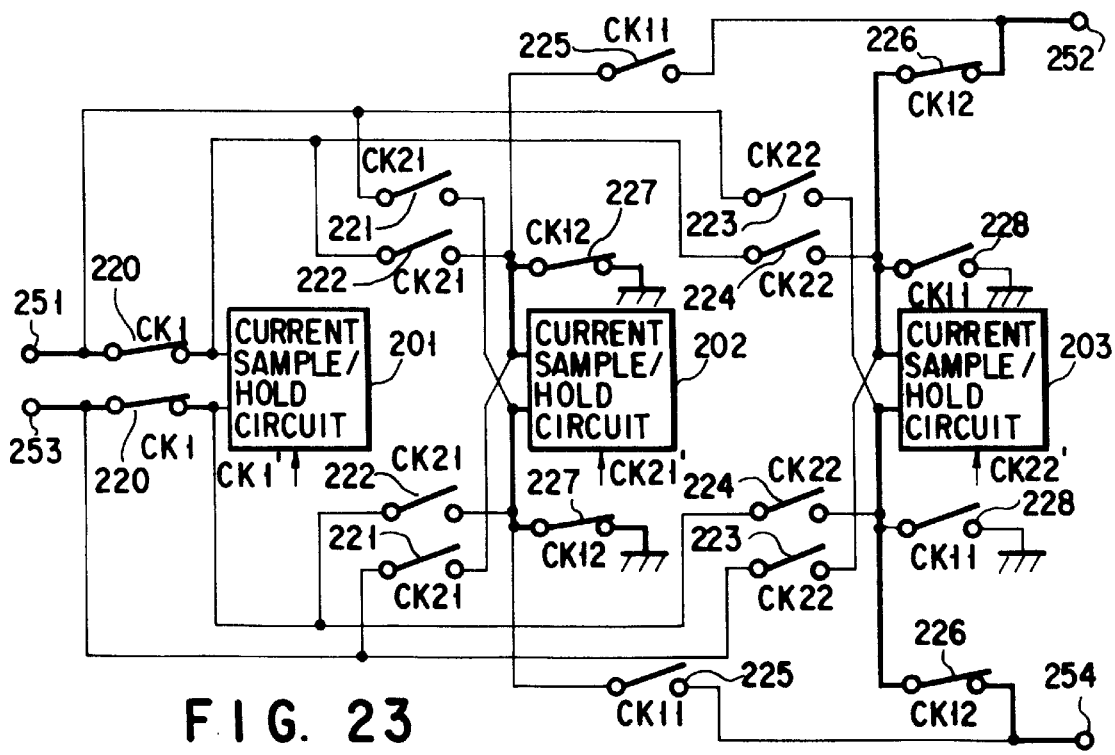
FIG. 23 is a circuit diagram for explaining the operation of the third embodiment.

In the first operation mode, the differential input current from the differential current input terminals 251 and 253 is input to the first differential current sample/hold circuit 201 through the switches 220 which are turned on in response to a clock CK1, and sampled and held by the differential current sample/hold circuit 201 at the timing of a clock CK1', as shown in FIG. 23. At this time, the differential output current from the third differential current sample/hold circuit 203 is output from the differential current output terminals 252 and 254 through the switches 226 which are turned on in response to a clock CK12.

At this time, to prevent an undesired potential variation, the output terminals of the second differential current sample/hold circuit 202 are connected to a constant potential point, e.g., ground through the switches 227 which are turned on in response to the clock CK12. More specifically, the differential current sample/hold circuit 202 is constituted by a current source. When the output terminal has a high impedance, the potential of the output terminal largely changes to saturate the circuit or prolong the transient response time in the next sampling operation, so such potential variation is prevented by the above arrangement. If degradation in A/D conversion accuracy due to the potential variation of the output terminal of the second differential current sample/hold circuit 202 does not pose a problem, and no high-speed operation is required, this arrangement need not always be employed.

<Second Operation Mode>

Figure 24:
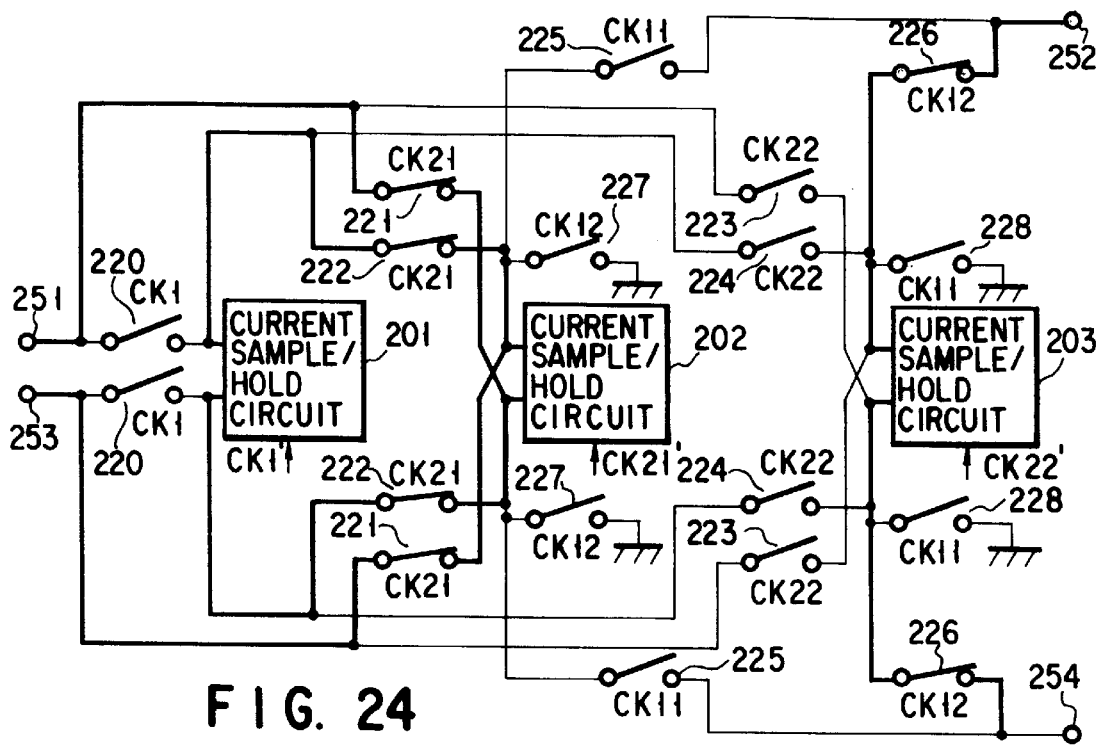
FIG. 24 is a circuit diagram for explaining the operation of the third embodiment.

In the second operation mode, the switches 221 and 222 are turned on in response to a clock CK21, so the differential input current from the differential current input terminals 251 and 253 is connected and added, through the connection, to the differential output current from the first differential current sample/hold circuit 201 in opposite phases, as shown in FIG. 24. This sum differential current is sampled and held by the second differential current sample/hold circuit 202 in response to a clock CK21'. With this operation, a current twice the differential input current is held by the second differential current sample/hold circuit 202. The switches 226 are turned on in response to the clock CK12, so the current held by the third differential current sample/hold circuit 203 is output from the differential current output terminals 252 and 254 through the switches 226.

<Third Operation Mode>

Figure 25:
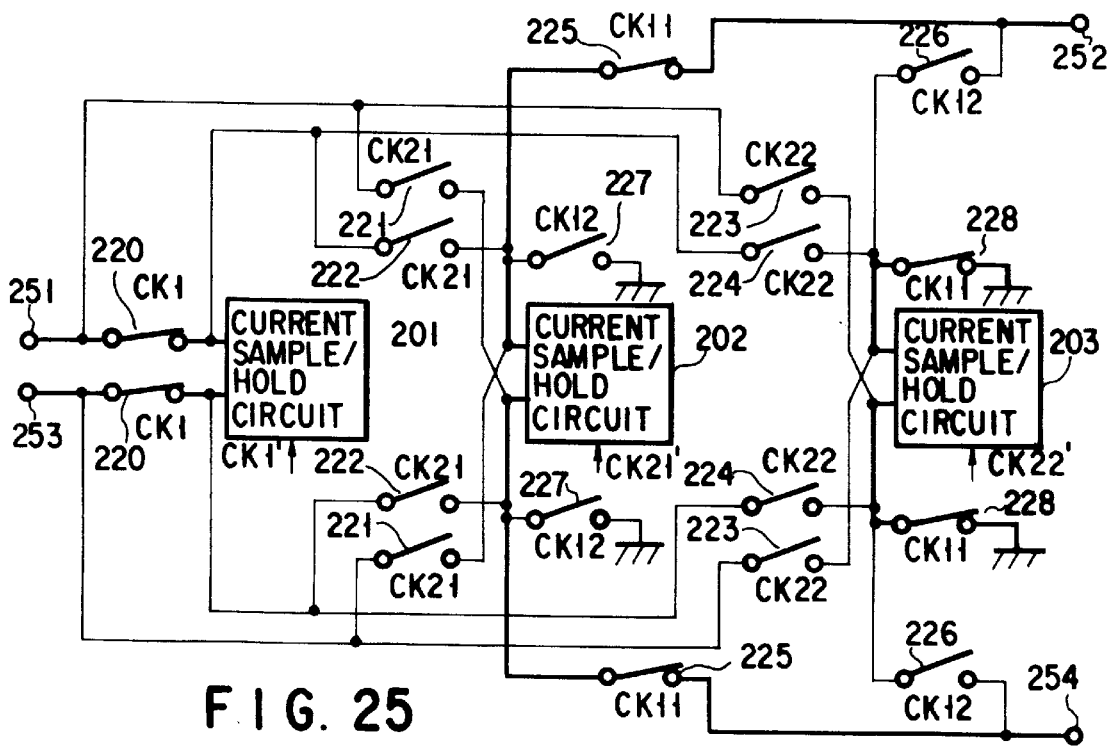
FIG. 25 is a circuit diagram for explaining the operation of the third embodiment.

In the third operation mode, the switches 225 are turned on in response to a clock C11, so a current twice the differential input current held by the second differential current sample/hold circuit 202 is output through the switches 225, as shown in FIG. 25. The differential input current is sampled and held by the first differential current sample/hold circuit 201 in response to the clock CK1.

At this time, to prevent an undesired potential variation, the output terminals of the third differential current sample/hold circuit 203 are connected to a constant potential point, e.g., ground through the switches 228 which are turned on in response to the clock CK11. If degradation in A/D conversion accuracy due to the potential variation of the output terminals of the third differential current sample/hold circuit 203 does not pose a problem, this arrangement need not always be employed.

<Fourth Operation Mode>

Figure 26:
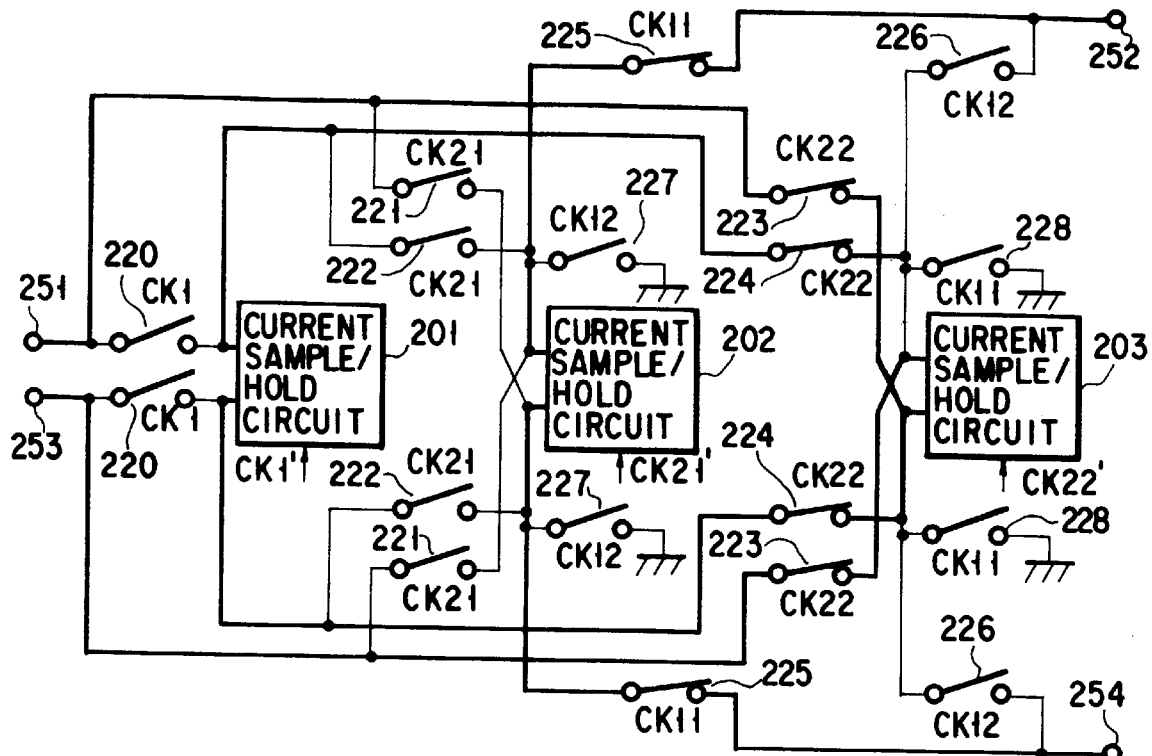
FIG. 26 is a circuit diagram for explaining the operation of the third embodiment.

In the fourth operation mode, the switches 223 and 224 are turned on in response to a clock CK22, so the differential input current from the differential current input terminals 251 and 253 is connected and added, through the connection, to the differential output current from the first differential current sample/hold circuit 201 in opposite phases, as shown in FIG. 26. This sum differential current is sampled and held by the third differential current sample/hold circuit 203 in response to a clock CK22'. With this operation, a current twice the differential input current is held by the third differential current sample/hold circuit 203. At this time, the switches 225 are turned on in response to the clock CK11, so the current held by the second differential current sample/hold circuit 202 is output from the differential current output terminals 252 and 254 through the switches 225.

As described above, in this embodiment, a differential current obtained by sampling and holding the differential input current by the first differential current sample/hold circuit 201 is added to the differential input current in opposite phases to generate a current twice the input current. This current is alternately sampled and held by the second and third differential current sample/hold circuits 202 and 203 and alternately output. With this arrangement, a current amplifier for doubling the current can be realized.

As in the first embodiment, the accuracy of the current amplification factor is not influenced by the accuracy of transistors constituting the current mirror, unlike bit cells used in the conventional current mode pipe line type A/D converter for doubling the current in accordance with the input-to-output current ratio of the current mirror. For this reason, high accuracy can be attained without increasing the cost. In addition, the sample circuit need not be operated at a speed twice the sampling rate, unlike the conventional arrangement using the switched current mirror. For this reason, the conversion accuracy does not degrade even in a high-speed operation, so the current consumption can be reduced.

In this embodiment, the differential current sample/hold circuits 201 to 203 are used. The positive-phase input/output of the first differential current sample/hold circuit 201 and the positive-phase input/output and negative-phase input/output of the second and third differential current sample/hold circuits 202 and 203 are connected in reverse, thereby realizing an operation corresponding to the current inverter 16 in the first embodiment. The current inverter can be omitted.

When a differential arrangement is employed, as in this embodiment, the common mode component of the differential current must be canceled. As has been mentioned in the description of the prior art, unless the common mode component is canceled, the current of the common mode component is also doubled to sometimes saturate the output current. If the common mode component is nonuniformly corrected for the positive and negative phases of the differential current, the nonuniform component is added to the differential output current as a differential current, resulting in an error in differential output current.

In this embodiment, however, the common mode component of the differential input current is canceled by the current amplifier. A circuit exclusively used to cancel the common mode component is not required. This is because the output from the differential current sample/hold circuit corresponds to the inverted current of the differential input. This can be seen from the fact that when the differential input currents to the current amplifier are $Iin+=Is+Ic$ and $Iin-=-Is+Ic$, the differential output currents from the current amplifier are $Iout+=-(-Iin++Iin-)=2Is$ and $Iout-=-(-Iin-+Iin+)=-2Is$ where Is is the signal component, and IC is the common mode component.

Arrangements of the differential current sample/hold circuit used in the third embodiment will be described next with reference to FIGS. 27 to 29.

Figure 27:
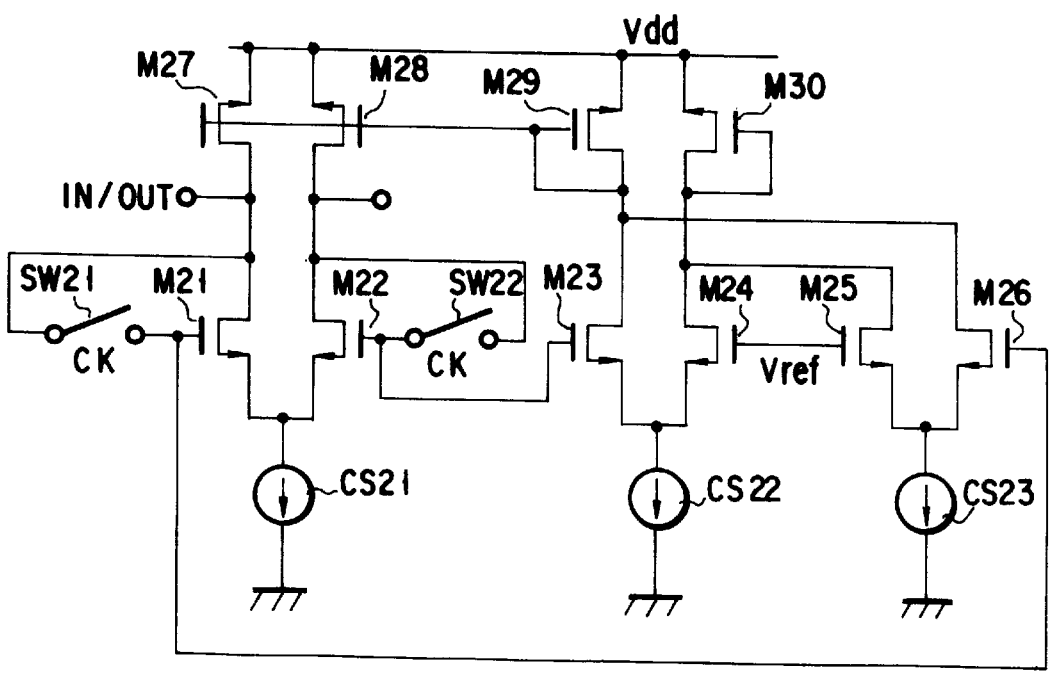
FIG. 27 is a circuit diagram showing a differential current sample/hold circuit.

A differential current sample/hold circuit shown in FIG. 27 is constituted using three differential pairs (differential transistor pairs). The first differential pair has transistors M21 and M22; the second differential pair, transistors M23 and M24; and the third differential pair, transistors M25 and M26. The common sources of the transistor pairs M21 and M22, M23 and M24, and M25 and M26 are connected to current sources CS21, CS22, and CS23, respectively.

The differential input/output current is input/output through a pair of terminals IN/OUT. Switches SW21 and SW22 for sampling the current are connected between the gates and drains of the transistors M21 and M22, respectively. The gate capacitances of the transistors M21 and M22 are used as capacitors for holding the current. However, capacitors may be independently arranged, as in the current sample/hold circuit of the first embodiment.

The differential component of the differential input/output current is input/output from the first differential pair made of the transistors M21 and M22 in accordance with the differential input voltage between the gates of the transistors M21 and M22. The in-phase component of the differential input/output current is supplied to diode-connected transistors M29 and M30 by an in-phase voltage detector comprising the second differential pair of the transistors M23 and M24 and the third differential pair of the transistors M25 and M26 in accordance with the in-phase voltage of the gates of the transistors M23 and M26, and input/output through a current mirror circuit constituted by the transistors M29, M27, and M28.

In the sample mode, when the switches SW21 and SW22 are turned on in response to a clock CK, the transistors M21 and M22 are diode-connected to form a feedback loop such that the differential input current from the input/output terminals IN/OUT equals the sum current of the differential component and in-phase component, so the gate potentials of the transistors M21 and M22 change. In the hold mode, when the switches SW21 and SW22 are turned off, the potentials are held in the gate capacitances of the transistors M21 and M22. With this operation, a differential output current equal to the differential input current is output from the input/output terminals IN/OUT, and the current is held.

Figure 28:
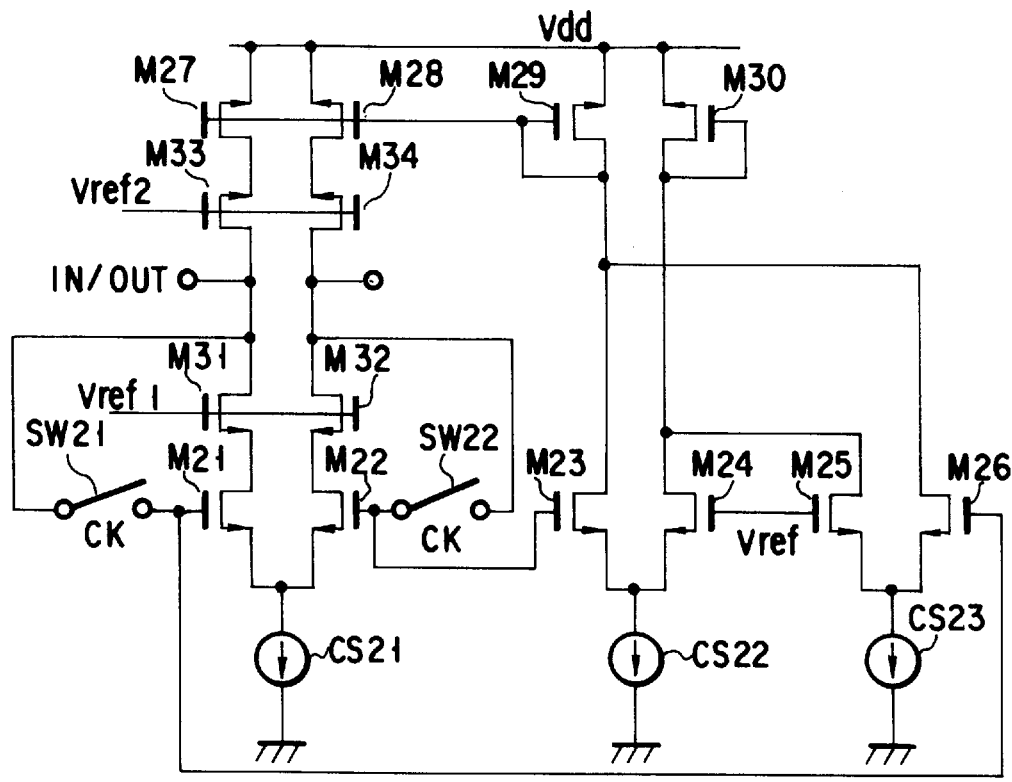
FIG. 28 is a circuit diagram showing another differential current sample/hold circuit.

In a differential current sample/hold circuit shown in FIG. 28, pairs of cascade transistors M31 and M32, and M33 and M34 are added to the pairs of transistors M21 and M22, and M23 and M24, respectively. A reference voltage Vref1 is applied to the gates of the cascade transistors M31 and M32, and a reference voltage Vref2 is applied to the gates of the cascade transistors M33 and M34. With this arrangement, the output impedance in the hold mode increases, so the variation/error in output current due to the voltage of the input/output terminals IN/OUT can be minimized.

Figure 29:
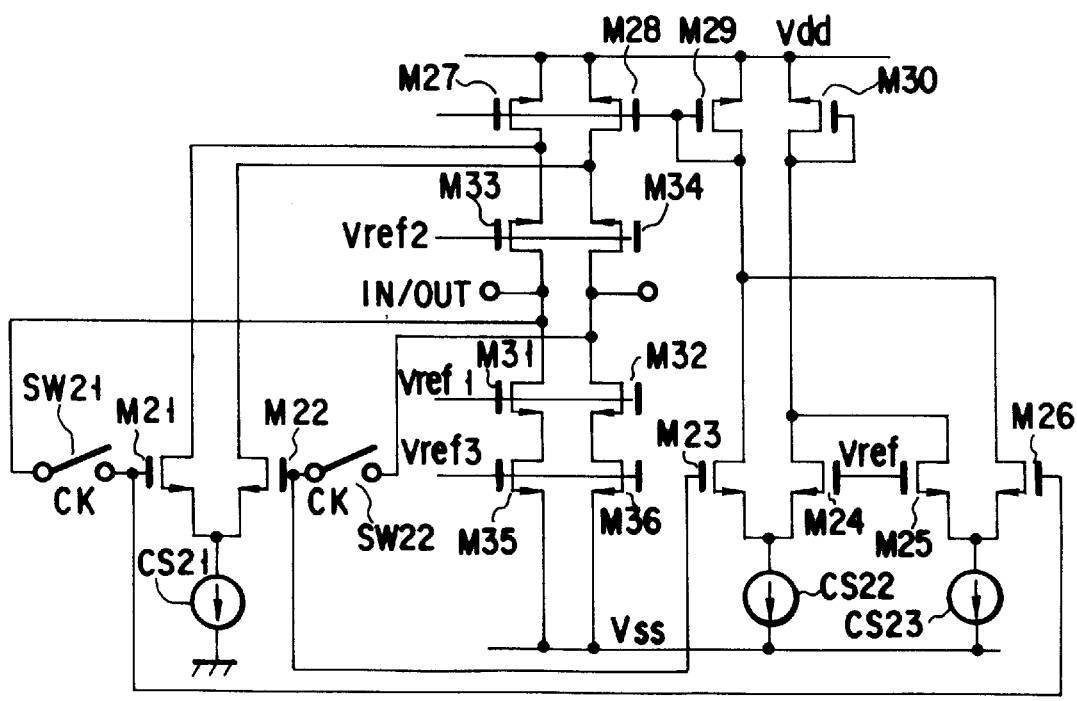
FIG. 29 is a circuit diagram showing still another differential current sample/hold circuit.

In a differential current sample/hold circuit shown in FIG. 29, transistors M35 and M36 are added to the arrangement shown in FIG. 28 to form a folded cascade circuit, and the transistors M21 and M22 of the first differential pair are connected to the transistors M27 and M28 as loads. As compared to the arrangement shown in FIG. 28, the number of transistors connected between a current Vdd and ground decreases, so a low-voltage operation can be realized.

In a differential current sample/hold circuit shown in FIG. 30, a regulated cascade circuit is used in the arrangement shown in FIG. 29. More specifically, currents are fed back to the cascade transistors M31, M32, M33, and M34 by operational amplifiers OP31, OP32, OP33, and OP34, respectively. With these feedback loops, the drain voltages of the transistors M35, M36, M27, and M28 are kept constant, and the output impedance viewed from the input/output terminals IN/OUT becomes very high. For this reason, changes in output voltage due to voltage changes of the input/output terminals IN/OUT can be minimized, and the sample/hold accuracy, and accordingly, the A/D conversion accuracy can be improved.

An embodiment of a current mode pipe line type A/D converter using the current amplifier described in the third embodiment will be described next. FIG. 31 is a schematic block diagram showing this current mode pipe line type A/D converter. An input current Iin input from a current source 260 is passed through a plurality of bit cells (unit A/D converters) 250-1, 250-2, . . . , 250-n which are pipe-line-connected, thereby obtaining n-bit A/D conversion output.

Figure 32:
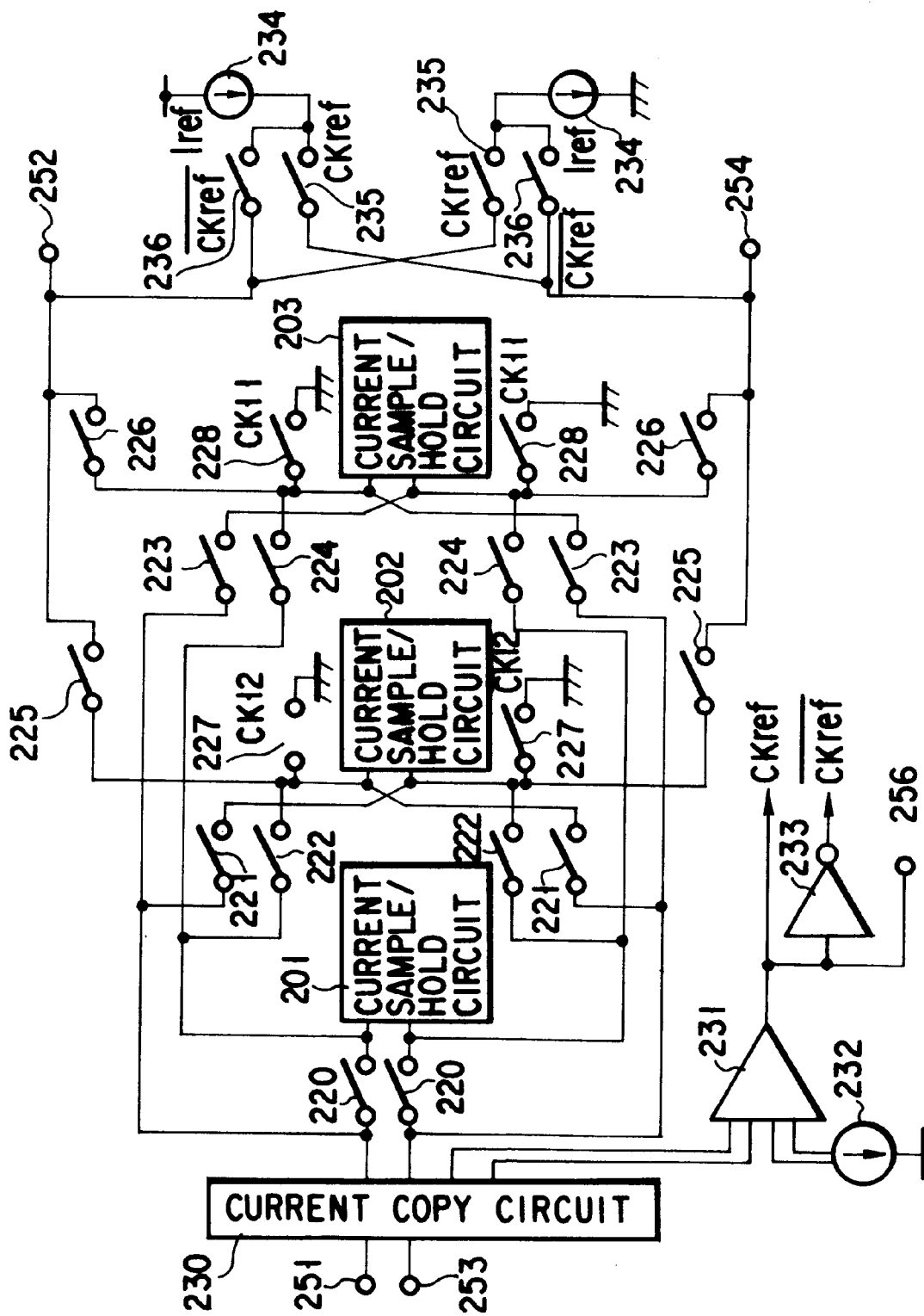
FIG. 32 is a circuit diagram showing the arrangement of a bit cell in the fourth embodiment.

FIG. 32 shows the arrangement of one bit cell. The same reference numerals as in FIG. 22 denote the same parts in FIG. 32. In this bit cell, a current copy circuit 230, a current comparator 231, a differential reference current source 232, an inverter 233, a reference current source 234, switches 235 and 236, and a digital data output terminal 256 are added to the current amplifier described in the third embodiment, which comprises the differential current sample/hold circuits 201 to 203, the switches 220 to 228, the differential current input terminals 251 and 253, and the differential current output terminals 252 and 254.

The differential input current from the differential current input terminals 251 and 253 is input to the current amplifier through the current copy circuit 230, and doubled and output from the differential current output terminals 252 and 254, as in the third embodiment. The differential input current is also copied to the input terminals of the current comparator 231 and compared with a differential reference current from the differential reference current source 232 by the current comparator 231. The switches 235 and 236 are ON/OFF-controlled in response to a clock CKref as a comparison result from the current comparator 231 and a clock obtained by inverting the clock CKref by the inverter 233, so one of the output current of the current amplifier and a current obtained by subtracting a reference current Iref from the switch 224 from the output current of the current amplifier is output from the differential current output terminals 252 and 254.

With the series of operations, 1-bit A/D conversion is performed. The output from the current comparator 231 is output from the digital data output terminal 256 as a digital output. Simultaneously, the residual current obtained by subtracting the 1-bit quantized output from the input current is output from the differential current output terminals 252 and 254 to the next bit cell as an output current. By pipeline-connecting the n bit cells, as shown in FIG. 31, n-bit A/D conversion is performed.

The arrangement of the reference current source will be described below.

In the above-described current amplifier of the present invention, a reference current source is used. When n bit cells each including this current amplifier are pipe-line-connected to realize a current mode pipe line type A/D converter, the current values of the reference current sources of all bit cells must accurately equal each other. The reference current is subtracted from the input current in each bit cell. If the reference current has an error, the conversion accuracy degrades because the error component is equivalent to noise.

Figure 33:
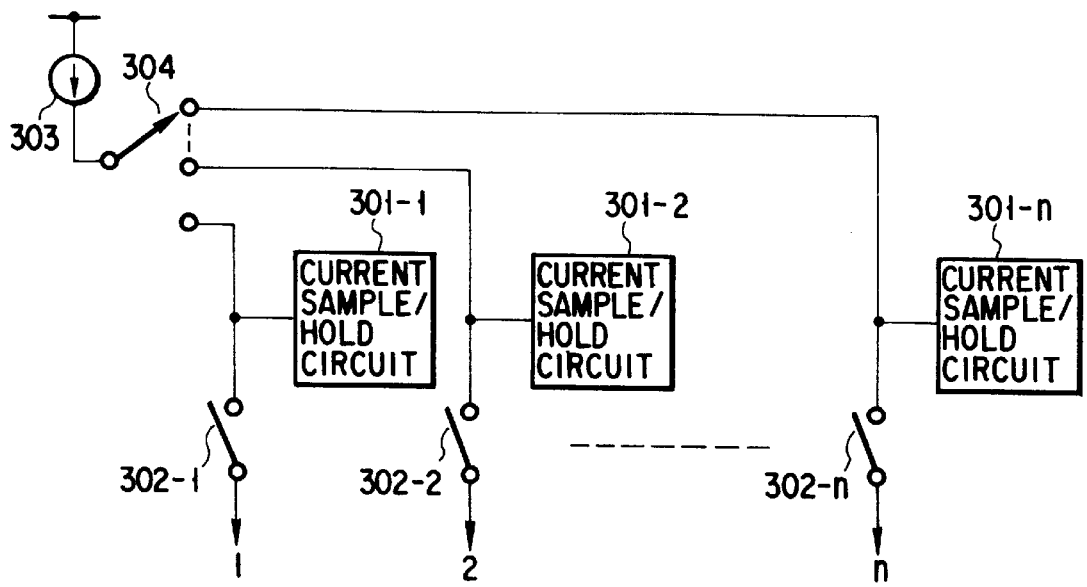
FIG. 33 is a circuit diagram showing the arrangement of a reference current source.

FIG. 33 is a circuit diagram showing the arrangement of a reference current source which solves the above problem. In this arrangement, n current sample/hold circuits 301-1 to 301-n are arranged in correspondence with n bit cells. A reference current from a common reference current source 303 is sequentially supplied to the current sample/hold circuits 301-1 to 301-n through a switch 304 and sampled and held. More specifically, one common reference current is copied by the current sample/hold circuits 301-1 to 301-n. The currents held by the current sample/hold circuits 301-1 to 301-n are supplied to the current amplifiers of corresponding bit cells through switches 302-1 to 302-n, respectively. With this arrangement, the current values of the reference current sources used in the bit cells can be accurately equalized.

In the current mode pipe line type A/D converter, since the input current is doubled step by step toward the last stage, the accuracy required of the reference current is gradually halved toward the last stage. Therefore, on the last stage side, a conventional current mirror can be used as a reference current source.

An embodiment in which the present invention is applied to a current mode cyclic type A/D converter will be described next with reference to FIGS. 34, 35, and 36.

Figure 34:
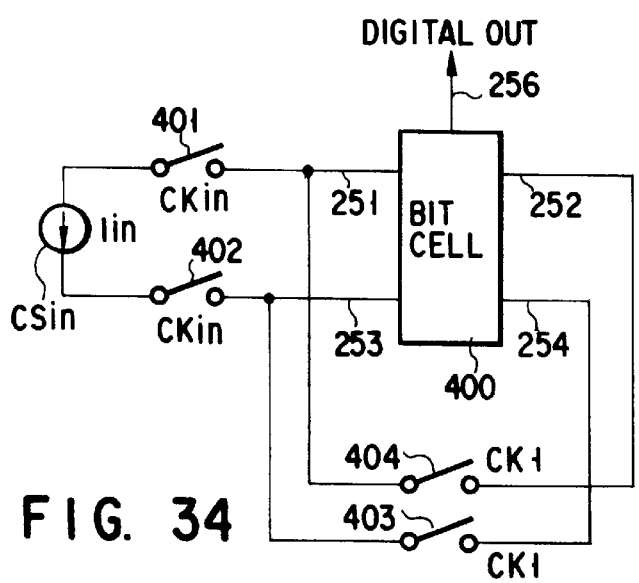
FIG. 34 is a block diagram showing the arrangement of a current mode pipe line type A/D converter according to the fifth embodiment of the present invention.
Figure 35:
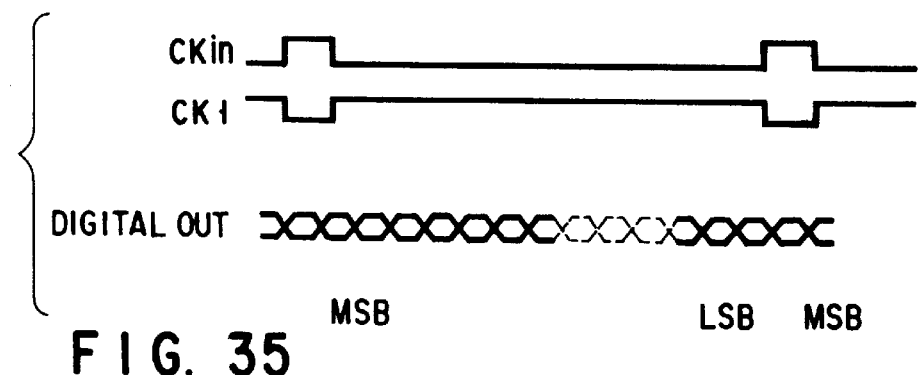
FIG. 35 is a timing chart for explaining the operation of the fifth embodiment.

In FIG. 34, a bit cell 400 has an arrangement shown in, e.g., FIG. 32. A differential input current from an input current source CSin is input to differential current input terminals 251 and 253 of the bit cell 400 through switches 401 and 402. The switches 401 and 402 are turned on when a clock CKin shown in FIG. 35 is at "HH". Switches 403 and 404 are inserted between the differential current input terminals 251 and 253 and differential current output terminals 252 and 254 of the bit cell 400. The switches 403 and 404 are turned on when a clock CK1 shown in FIG. 35 is at "H".

In this current mode cyclic type A/D converter, the basic operation of the bit cell 400 is the same as that of the current mode pipe line type A/D converter described in the fourth embodiment except that the differential output current from the differential current output terminals 252 and 254 of the bit cell 400 is input to the differential current input terminals 251 and 253 of the same bit cell 400. More specifically, in the first clock period, the current is input to the bit cell 400 from the external input current source CSin. In the subsequent clock period, the bit cell 400 receives its output current. One-bit conversion is performed in one clock period, so n-bit conversion is realized at n clock periods.

Figure 36:
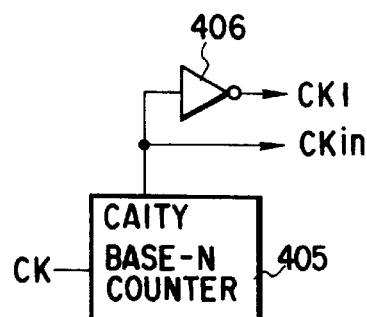
FIG. 36 is a block diagram showing the arrangement of another current mode pipe line type A/D converter according to the fifth embodiment of the present invention.

The clocks Ckin and CK1 are in opposite phases and can be generated by the arrangement shown in FIG. 36. More specifically, the carry output from a base-n counter 405 which receives a reference clock CK may be used as the clock CKin, and a clock obtained by inverting the clock CKin by an inverter 406 may be used as the clock CK1.

In this embodiment, the bit cell is constituted by a current amplifier having the current sample/hold circuit described in the first embodiment. However, the current mode cyclic type A/D converter can also be realized by forming the bit cell using a current amplifier having the differential current sample/hold circuit described in the third embodiment.

In the above embodiments, the current amplifier has one current comparator and 1-bit unit A/D converters (bit cells). However, each bit cell can have a plurality of current comparators, so the bit cell can be formed as a multi-bit unit A/D converter.

As described above, according to the present invention, a current obtained by sampling and holding the input current by the first current sample/hold means at a predetermined period is added to a current obtained by inverting the input current to generate a current twice the input current. This current is alternately sampled and held by the second and third current sample/hold means and alternately output such that the current is doubled. In this arrangement, the accuracy of the current amplification factor is not influenced by the accuracy of devices such as transistors, and the device accuracy need not be high. Since neither complex process nor trimming is required, and the circuit need not be operated at a speed twice the sampling rate, an inexpensive current amplifier capable of reducing the power consumption and preventing the accuracy from degrading due to the transient response of the circuit even in a high-speed operation can be provided.

When this current amplifier has a differential arrangement, the influence of noise from the digital system can be minimized, and simultaneously, the common mode component can be canceled by processing in the current amplifier without arranging any circuit exclusively used to cancel the common mode component. Therefore, saturation of the output current due to amplification of the current of the common mode component or errors generated when the common mode component is nonuniformly corrected for the positive and negative phases of the differential current and the nonuniform component is added to the differential output current as a differential current can be prevented.

In addition, according to the present invention, using the above current amplifier, a highly accurate current mode A/D converter, a current mode pipe line type A/D converter, or a current mode cyclic type A/D converter can be provided.

Additional advantages and modifications will readily occurs to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

I claim:

1. A current amplifier comprising:
   a first current sample/hold circuit for sampling and holding an input current at a predetermined period;
   a current inverter for inverting the input current;
   a current adder for adding an output current from said current inverter and an output current from said first current sample/hold circuit;
   second and third current sample/hold circuits for alternately sampling and holding an output current from said current adder; and
   an output circuit for alternately outputting, as an output current, the current held by said second and third current sample/hold circuits.

2. An amplifier according to claim 1, further comprising means for always connecting an output terminal of one of said second and third current sample/hold circuits to a constant potential point, when the other current sample/hold circuit outputs the current.

3. An amplifier according to claim 1, wherein each of said current sample/hold circuits comprises a reference current source, a MOS transistor connected between said reference current source and ground, a sampling switch connected to a drain-gate path of said MOS transistor, and a holding capacitor connected to a gate-source path of said MOS transistor whose drain is connected to an input/output terminal.

4. An amplifier according to claim 3, further comprising a cascade transistor cascade-connected to said transistor, and means for applying a reference voltage to a gate of said cascade transistor.

5. An amplifier according to claim 3, further comprising a low threshold voltage type cascade transistor cascade-connected to said transistor with gates of said transistor and said cascade transistor being commonly connected.

6. An amplifier according to claim 1, wherein each of said current sample/hold circuits comprises n-and p-channel MOS transistors connected in series and each having a drain connected to an input/output terminal, a switch for connecting gates of said transistors to said input/output terminal, and a capacitor connected between said gate of said n-channel MOS transistor and ground.

7. An amplifier according to claim 6, further comprising n- and p-channel MOS transistors respectively cascade-connected to said n- and p-channel MOS transistors, and means for applying a reference voltage to said transistors.

8. An amplifier according to claim 6, further comprising low threshold voltage type n- and p-channel MOS transistors respectively cascade-connected to said n- and p-channel MOS transistors with gates of said n- and p-channel MOS transistors and said low threshold voltage type n- and p-channel MOS transistors being commonly connected.

9. An amplifier according to claim 1, wherein each of said current sample/hold circuits comprises a pair of switches which are turned on in a sample mode, a pair of first MOS transistors connected to an input/output terminal, a pair of second MOS transistors each having a gate voltage which changes in accordance with a magnitude of an input current input from said input/output terminal through said first MOS transistor in response to an ON state of said switch, and a capacitor for holding the gate voltage of said second MOS transistor when said switch is turned off in a hold mode.

10. An amplifier according to claim 1, wherein each of said current sample/hold circuits comprises a reference current source, first and second MOS transistors serially connected between said reference current source and ground, a sampling switch connected between a drain of said first MOS transistor and a gate of said second MOS transistor, a holding capacitor connected between said gate of said second MOS transistor and ground, and an operational amplifier which forms a feedback loop for said drain of said first MOS transistor to keep a drain voltage of said second MOS transistor at a constant value.

11. A current amplifier according to claim 1, wherein each of said current sample/hold circuits comprises first n- and p-channel MOS transistors connected in series and each having a drain connected to an input/output terminal, a switch for connecting gates of said transistors to said input/output terminal, a capacitor connected between said gate of said first n-channel MOS transistor and ground, second n- and p-channel MOS transistors respectively cascade-connected to said first n- and p-channel MOS transistors, and an operational amplifier which forms a feedback loop for said first MOS transistors to keep drain voltages of said first n- and p-channel MOS transistors at a constant value.

12. A current amplifier comprising:

a first current sample/hold circuit for sampling and holding a differential input current at a predetermined period;

a current adder for adding the differential input current and a differential output current from said first current sample/hold circuit;

second and third current sample/hold circuits for alternately sampling and holding a differential output current from said current adder; and an output circuit for alternately outputting, as an output current, the differential current held by said second and third current sample/hold circuits.

13. An amplifier according to claim 12, wherein said current adder is constituted by a wiring line connection point for synthesizing a positive-phase current of the differential output current from said first current sample/hold circuit and a negative-phase current of the differential input current, and a wiring line connection point for synthesizing a negative-phase current of the differential output current and the positive-phase current of the differential input current.

14. An amplifier according to claim 12, further comprising a circuit for connecting output terminals of said second and third current sample/hold circuits to a predetermined constant potential point during a period other than an output period.

15. An amplifier according to claim 12, further comprising a connection for inputting the differential input current to said second and third current sample/hold circuits in a phase opposite to that of the input to said first current sample/hold circuit.

16. An analog/digital converter comprising:

a first current sample/hold circuit for sampling and holding an input current at a predetermined period;

a current inverter for inverting the input current;

a current adder for adding an output current from said current inverter and an output current from said first current sample/hold circuit;

second and third current sample/hold circuits for alternately sampling and holding an output current from said current adder;

an output circuit for alternately outputting, as an output current, the current held by said second and third current sample/hold circuits;

a current comparator for comparing the input current with a reference current and outputting digital data; and a circuit for selectively outputting one of the output current and a difference current between the output current and the reference current in accordance with a comparison result from said current comparator.

17. An analog/digital converter according to claim 16, wherein a plurality of analog/digital converters as unit analog/digital converters are pipe-line-connected.

18. An analog/digital converter comprising:

a first current sample/hold circuit for sampling and holding a differential input current at a predetermined period;

a current adder for adding the differential input current and a differential output current from said first current sample/hold circuit;

second and third current sample/hold circuits for alternately sampling and holding an output current from said current adder;

an output circuit for alternately outputting, as an output current, the current held by said second and third current sample/hold circuits;

a current comparator for comparing the differential input current with a reference current and outputting digital data; and a circuit for selectively outputting one of the differential output current and a difference current between the differential output current and the reference current in accordance with a comparison result from said current comparator.

19. An analog/digital converter according to claim 18, wherein a plurality of analog/digital converters as unit analog/digital converters are pipe-line-connected.

20. An analog/digital converter according to claim 18, wherein an output terminal of said analog/digital converter is connected to an input terminal.

21. A current amplifying method comprising the steps of:

sampling and holding an input current at a predetermined period;

inverting the input current;

adding an output current obtained in the current inversion step and an output current obtained in the step of sampling and holding an input current;

alternately sampling and holding a sum current obtained in the step of adding an output current; and alternately outputting, as an output current, the current held in the step of alternately sampling and holding a sum current.

* * * * *